US006522433B2

(12) United States Patent
Kelsey et al.

(10) Patent No.: US 6,522,433 B2
(45) Date of Patent: Feb. 18, 2003

(54) INTERFERENCE LITHOGRAPHY USING HOLEY FIBERS

(75) Inventors: Adam F. Kelsey, Waltham, MA (US); Mark A. Leclerc, Epping, NH (US); Daniel P. Resler, Carlisle, MA (US)

(73) Assignee: Optical Switch Corporation, Richardson, TX (US)

( * ) Notice: Subject to any disclaimer, the term of this patent is extended or adjusted under 35 U.S.C. 154(b) by 0 days.

(21) Appl. No.: 09/826,470

(22) Filed: Apr. 4, 2001

(65) Prior Publication Data

US 2002/0149849 A1 Oct. 17, 2002

Related U.S. Application Data

(63) Continuation of application No. 09/796,379, filed on Feb. 28, 2001.

(51) Int. Cl.[7] ............................. G03H 1/00; G03H 1/04; G02B 6/20
(52) U.S. Cl. ......................... 359/34; 359/35; 359/577; 359/900; 385/125
(58) Field of Search ........................... 359/34, 35, 577, 359/900; 385/125

(56) References Cited

U.S. PATENT DOCUMENTS

| 5,016,951 A | * | 5/1991 | Deason et al. ................ 359/15 |
| 5,052,764 A | * | 10/1991 | Moss et al. .................... 359/34 |
| 5,802,236 A | * | 9/1998 | DiGiovanni et al. ........ 385/125 |
| 6,418,258 B1 | * | 7/2002 | Wang ........................... 385/125 |

FOREIGN PATENT DOCUMENTS

| JP | 03-85578 A | * | 4/1991 |
| JP | 2000-35521 A | * | 2/2000 |
| WO | WO 97/47997 | * | 12/1997 |
| WO | WO 99/00685 | * | 1/1999 |
| WO | WO 00/49436 | * | 8/2000 |

OTHER PUBLICATIONS

T. M. Monro, et al., "New possibilities with holey fibers", Optical FIber Communication Conf., 2000, vol. 3, 2000, pp. 106–108.*

T.A. Birks, et al., "The analogy between photonic crystal fibres and step index fibres", Optical Fiber Comm. Conf., and International Conf. on Integrated Optics and Optical Fiber Comm. OFC/IOOC '99, Techn. Dig. 1999, vol. 4, pp. 114–116.*

R. Ghosh, et al., "Waveguiding properties of holey fibres and effective–V model", Electr. Lett., vol. 35, No. 21, pp. 1873–1875, Oct. 14, 1999.*

T.A. Birks, et al., "Full 2–D photonic bandgaps in silica/air structures", Electr. Lett., vol. 31, No. 22, pp. 1941–1943, Oct. 26, 1995.*

U.S. patent application Ser. No. 09/665,540, entitled "Period Reconfiguration and Closed Loop Calibration of an Interference Lithography Patterning System and Method of Operation," filed Sep. 19, 2000, 52 total pages.

U.S. patent application Ser. No. 09/796,665, entitled "Polarization Vector Alignment for Interference Lithography Patterning," filed Apr. 4, 2001, 64 total pages.

Birks, et al., "Endlessly single–mode photonic crystal fiber," Optical Society of America, 1997, 3 pages. vol. 22, no. 13, pp 961–963, Jul. 1, 1997.

(List continued on next page.)

Primary Examiner—John Juba, Jr.
(74) Attorney, Agent, or Firm—Baker Botts L.L.P.

(57) ABSTRACT

A method and apparatus for interference lithography utilize a fiber having a cladding region with axially formed holes surrounding a core region. The fiber emits an optical signal to perform interference lithography. A number of alternative variations in the size and arrangement of axially formed holes produces fibers having characteristics particularly adapted for receiving, communicating, and emitting optical signals for interference lithography.

42 Claims, 17 Drawing Sheets

OTHER PUBLICATIONS

Paula M. Noaker, "Fabrication of long holey fibers gets practical," *Laser Focus World*, Nov., 1999, 2 pages.

Broeng, et al., "Analysis of air-guiding photonic bandgap fibers," *Optical Society of America*, 2000, 3 pages. Optics Letters, vol. 25, No. 2, Jan. 15, 2000 pp 96–98.

Hobbs, et al., "Automated Interference Lithography Systems for Generation of Sub–Micron Feature Size Patterns," *SPIE Conference on Micromachine Technology for Diffractive and Holographic Optics, SPIE* vol. 3879, Sep. 20–21, 1999, 12 pages.

* cited by examiner

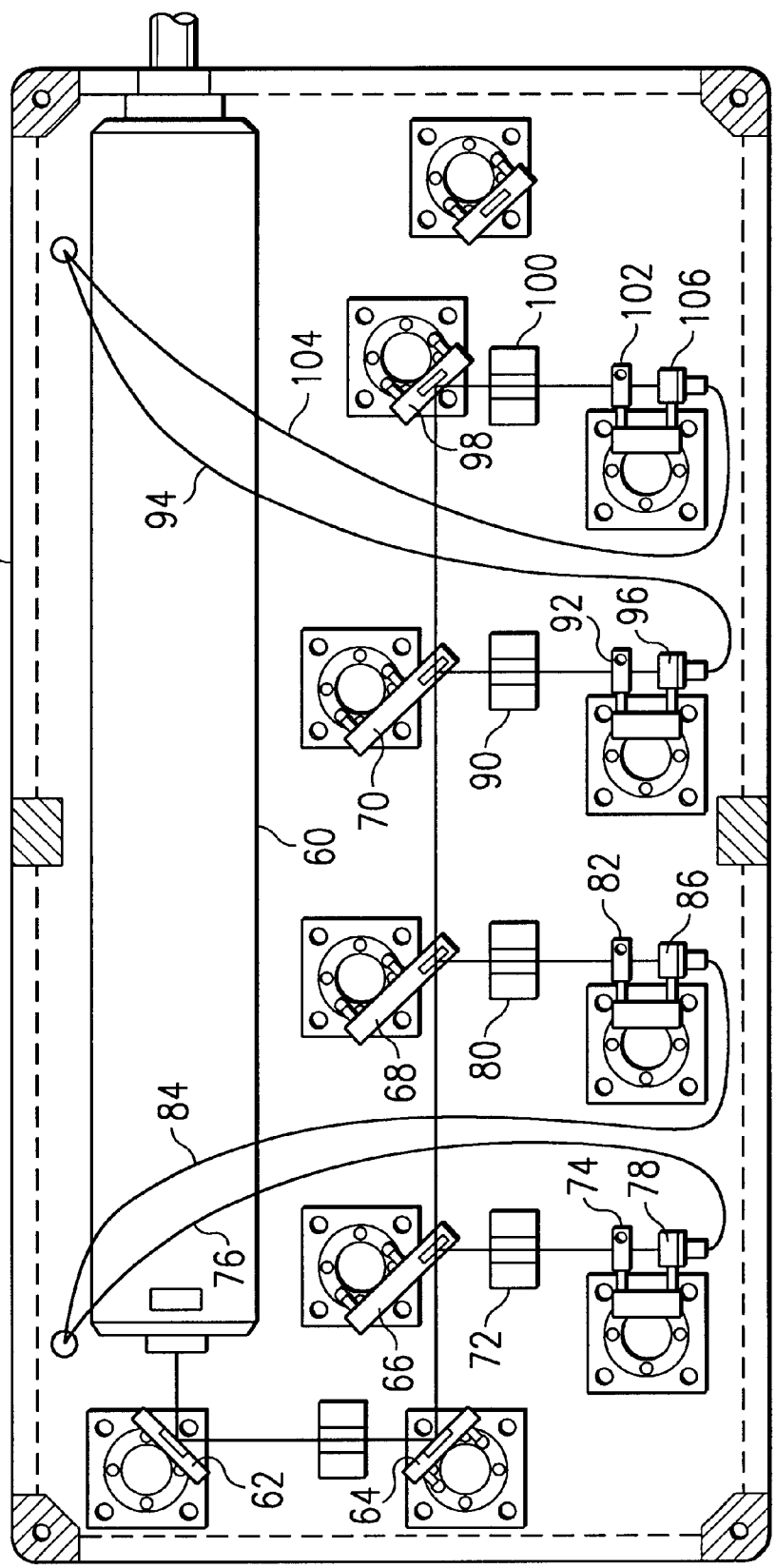

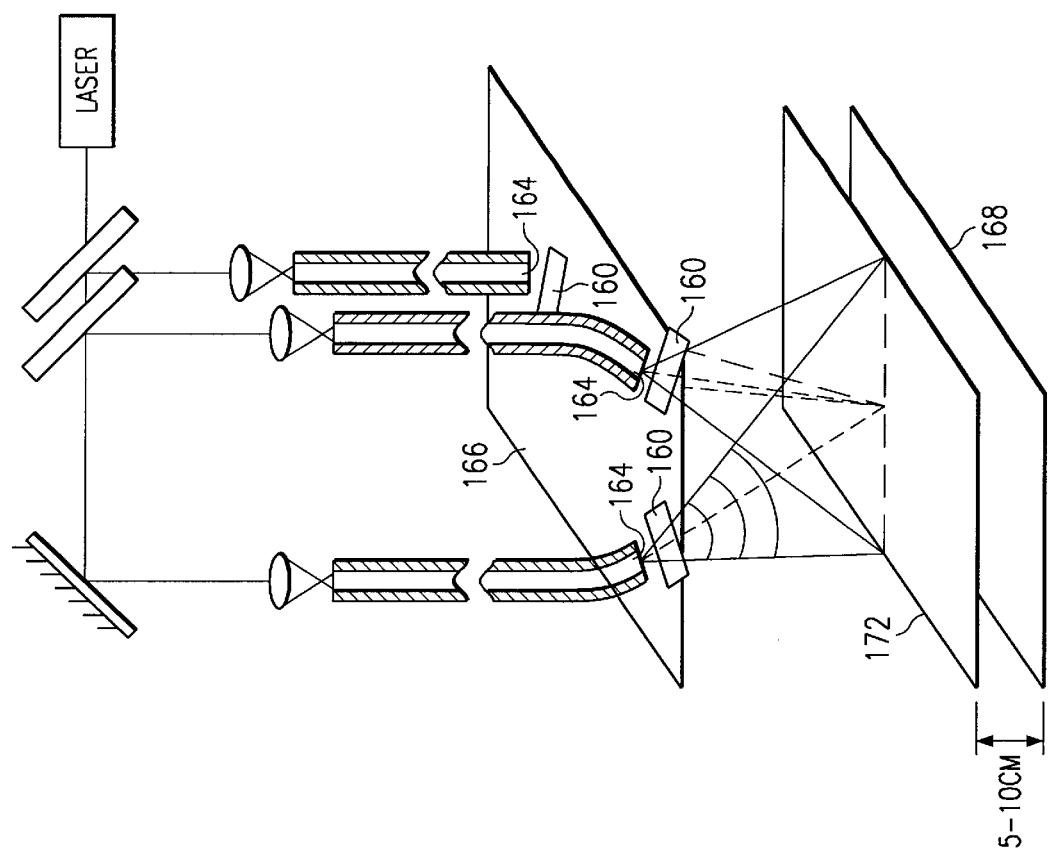
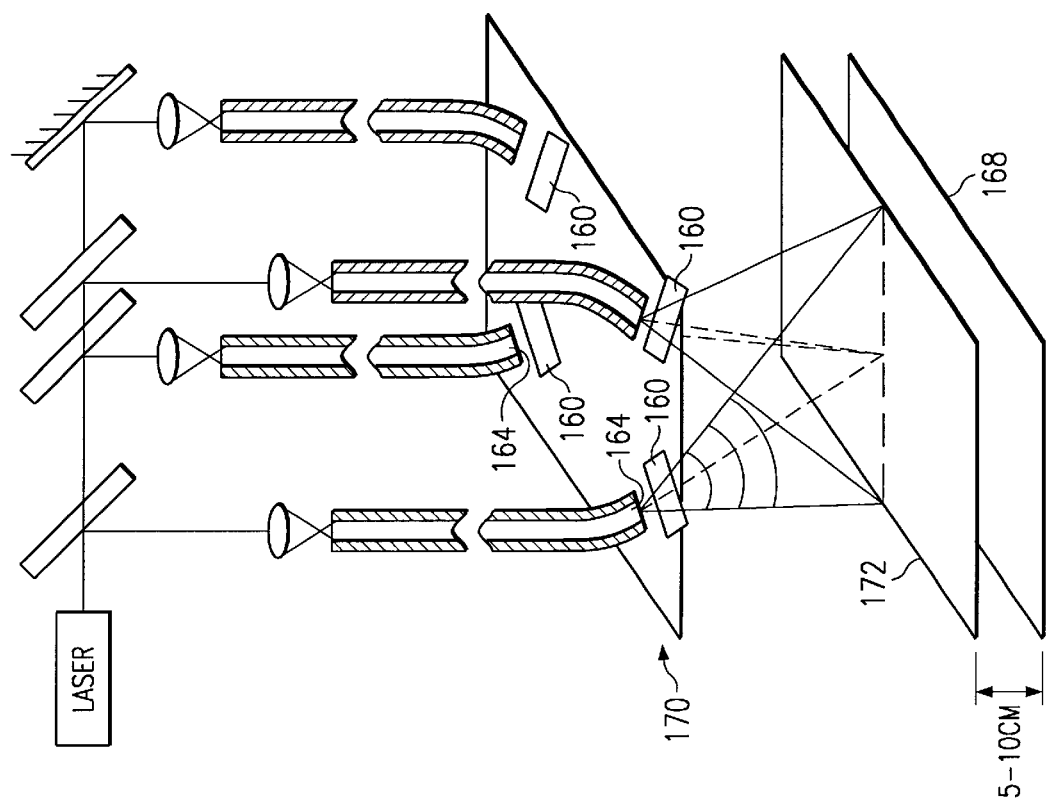

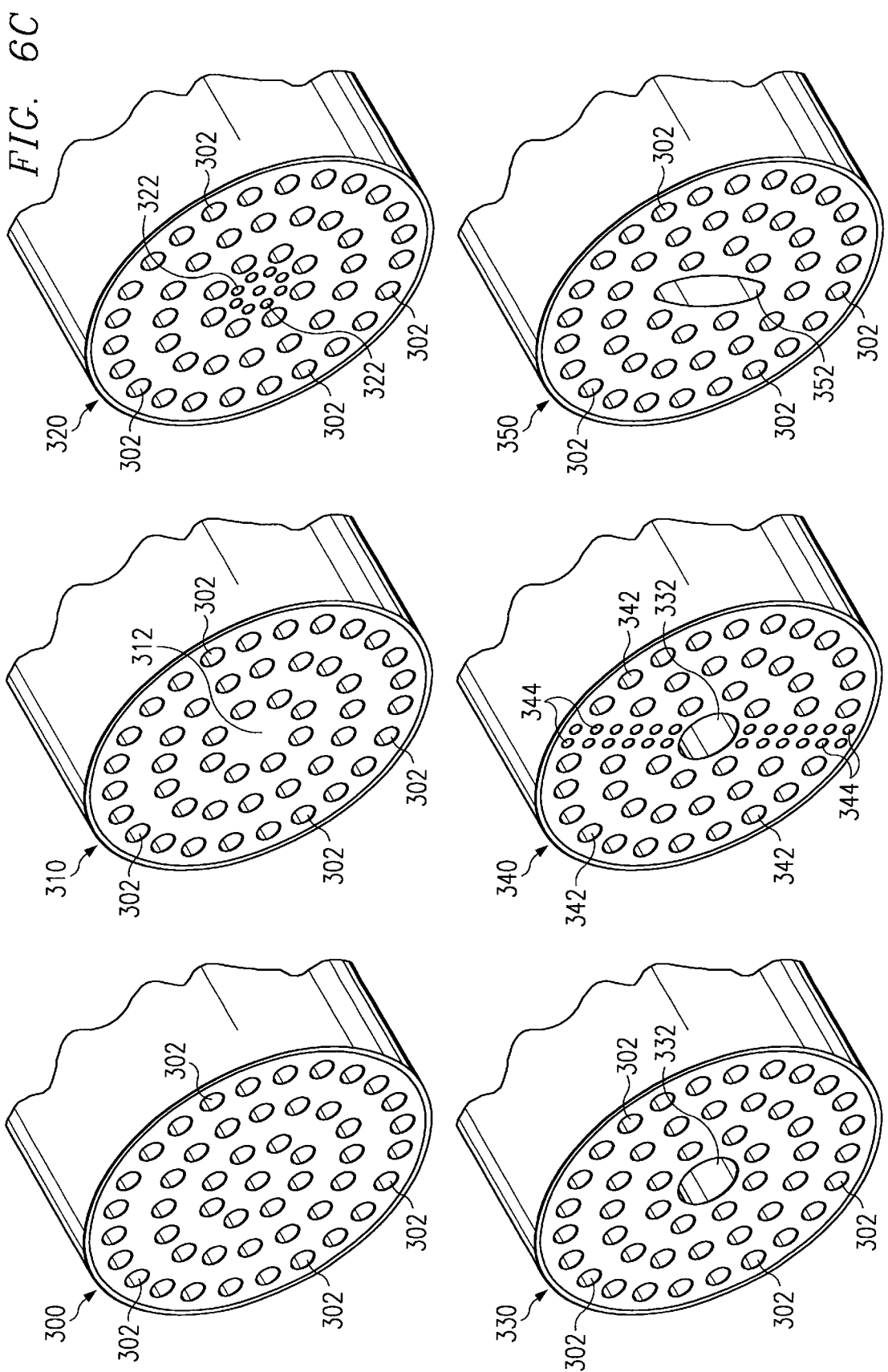

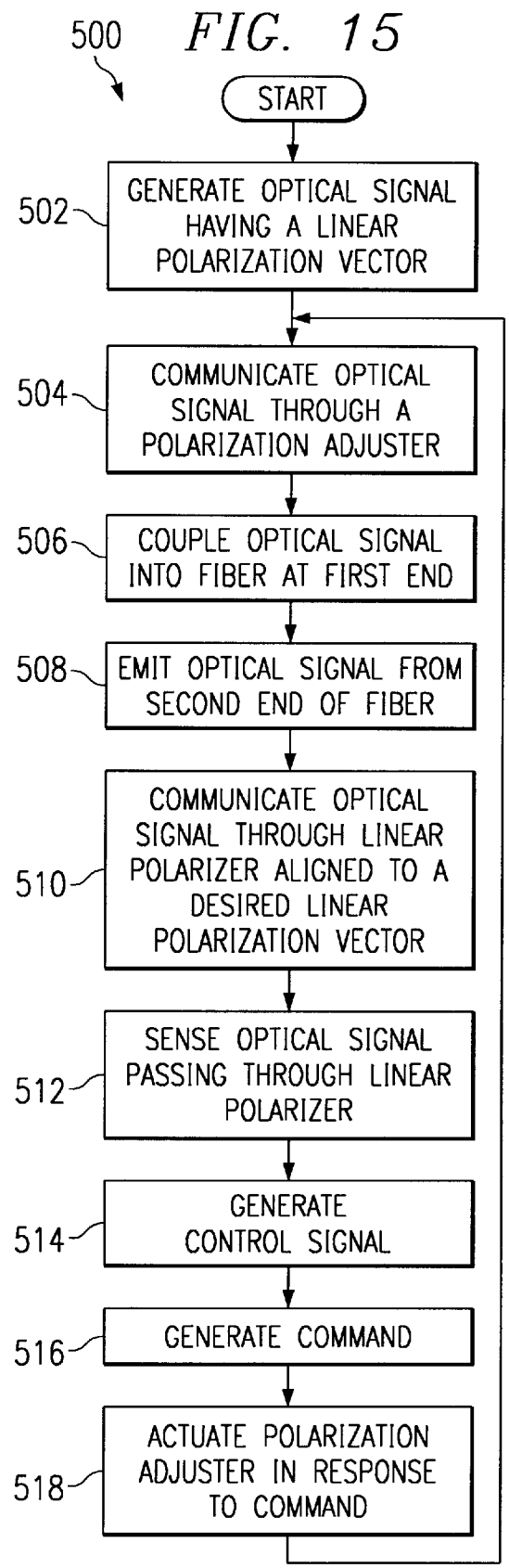

INTERFERENCE LITHOGRAPHY USING HOLEY FIBERS

RELATED APPLICATIONS

This application claims priority to U.S. patent application Ser. No. 09/796,379, filed Feb. 28, 2001, entitled "INTERFERENCE LITHOGRAPHY USING HOLEY FIBERS." This patent application also relates to U.S. patent application Ser. No. 09/665,540, filed Sep. 19, 2000, entitled "PERIOD RECONFIGURATION AND CLOSED LOOP CALIBRATION OF AN INTERFERENCE LITHOGRAPHY PATTERNING SYSTEM AND METHOD OF OPERATION" and U.S. patent Ser. No. 09/826,445, filed concurrently with this application entitled "POLARIZATION VECTOR ALIGNMENT FOR INTERFERENCE LITHOGRAPHY PATTERNING".

TECHNICAL FIELD OF THE INVENTION

This invention relates to the field of interference lithography and more particularly to interference lithography using holey fibers.

BACKGROUND OF THE INVENTION

The coherent addition of multiple exposure beams produces an interference pattern. An interference lithography system may be used to produce such an interference pattern, but it is often difficult and time consuming to reconfigure, calibrate, and maintain high quality interference patterns through continued use of the system. Radiation losses, component misalignments, and many other factors may contribute to the degradation of quality in the interference pattern.

SUMMARY OF THE INVENTION

An interference lithography system and method are provided that substantially eliminate or reduce disadvantages and problems associated with previous systems and methods.

In accordance with one embodiment of the present invention, a method for interference lithography generates an optical signal and communicates the optical signal using a fiber having a cladding region with axially formed holes surrounding a core region. The fiber emits the optical signal to perform interference lithography.

Another embodiment of the present invention is an apparatus for interference lithography that includes a support structure and at least two fibers coupled to the support structure that emit optical signals to perform interference lithography. Each fiber includes a cladding region having axially formed holes surrounding a core region.

Technical advantages of certain embodiments of the present invention include the use of fibers having axially formed holes surrounding a core region to deliver optical signals for interference lithography. These fibers, generally referred to as holey fibers, exhibit single mode characteristics over a much larger range of wavelengths than standard fiber. The single mode core may be smaller than a standard fiber core, which allows light to diverge faster as it exits fiber. This allows the fiber output to be placed closer to a recording plane in an interference lithography device to maintain a flat, central portion of the Gaussian exposure beam intensity distribution across the exposure area. Moreover, these holey fibers improve coupling efficiency, and may be less susceptible to stress and tight bends in the fiber delivery system that, in traditional fibers, may result in a loss of optical energy and changes in the polarization of the optical signal. Furthermore, holey fibers may exhibit significantly higher polarization extinction ratios that allow an optical signal having a linear polarization vector launched into the holey fiber along a polarization axis to maintain its orientation throughout the fiber length. Other advantages will be apparent to one skilled in the art from the following description, figures, and claims.

BRIEF DESCRIPTION OF THE DRAWINGS

For a more complete understanding of the present invention and its advantages, reference is now made to the following description taken in conjunction with the accompanying figures in which like reference numbers indicate like features and wherein:

FIG. 1b is a side elevation view in partial cross section of the patterning head of FIG. 1a;

FIG. 3 is an overhead or plan view of the laser source platform and depicts the dividing and coupling of the free space laser beam into the fiber optic cables;

FIG. 6a is an optical schematic diagram of the flexible beam delivery system based on fiber optic cables; a four beam configuration is shown;

FIG. 6b is an optical schematic diagram of the flexible beam delivery system based on the fiber optic cables; a three beam configuration is shown;

FIG. 6c illustrates several variations of holey fiber optic cables suitable for use with the tool system;

FIG. 8b is a computer generated contour plot of intensity distributions for a tool system including the shifted three-beam illumination of the present invention; superimposed on the figure is the rectangle representing the screen display, as in FIG. 8a;

FIG. 15 is a flowchart of a method to perform polarization vector alignment.

DETAILED DESCRIPTION OF THE INVENTION

Figure 1A:
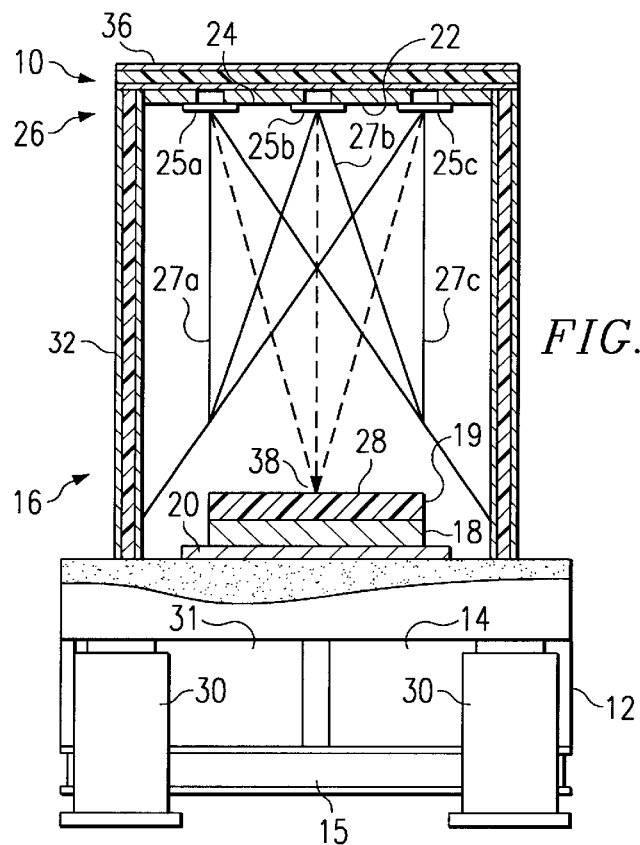
FIG. 1a is a front elevation view in partial cross section of a patterning head of the tool system of the present invention.
Figure 1B:
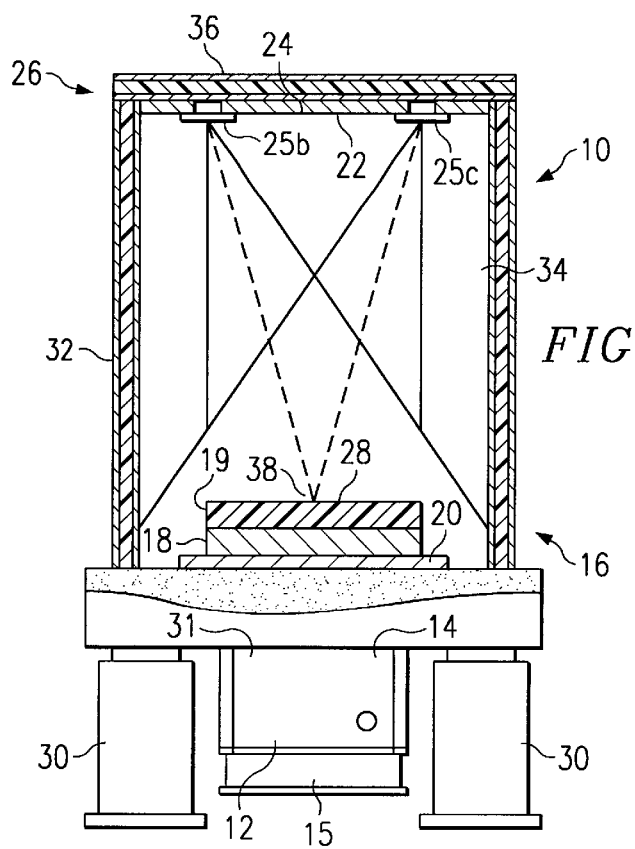
Figure 4A:
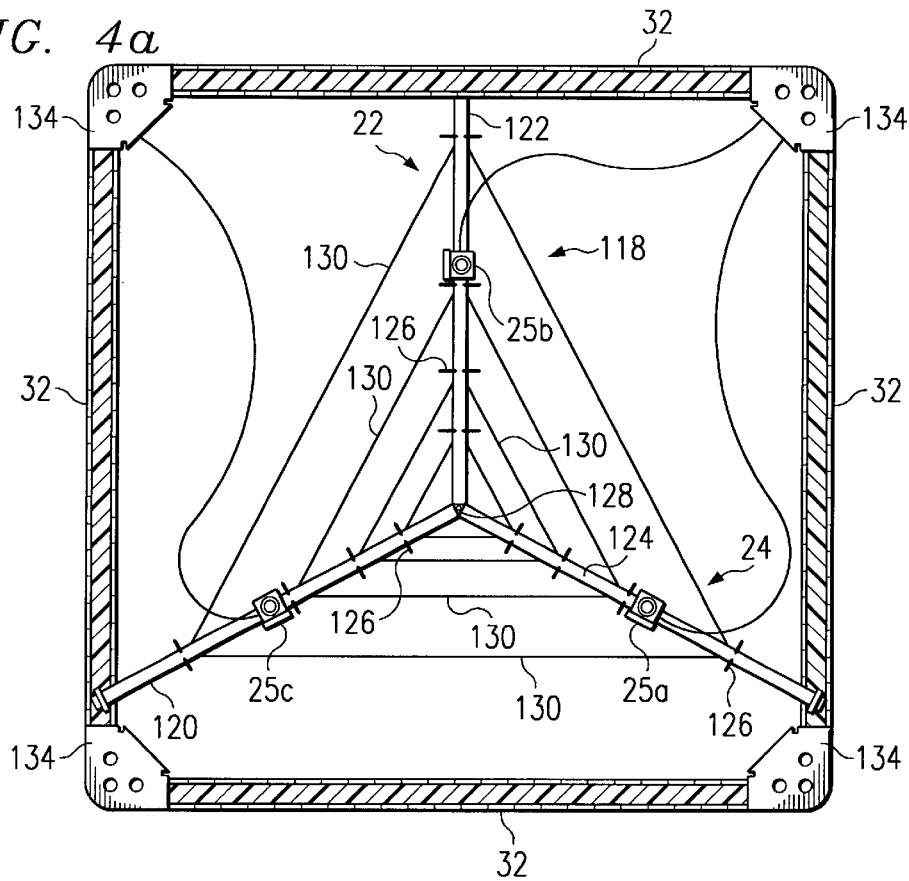
FIG. 4a is an overhead or plan view of the beam delivery breadboard with associated rails for the three beam delivery systems.

FIGS. 1a and 1b are, respectively, a front elevation view in partial cross section and a side elevation view in partial cross section, illustrating the patterning head 10 of the tool system of the present invention. Patterning head 10 is part of a cluster of tools making up a modern display manufacturing facility. Patterning head 10 includes three main levels: the lowest level 12 contains a laser illumination source 14 on a platform 15 (an embodiment of a laser illumination source is shown in FIG. 3); the middle level 16 is a panel mount or chuck 18 (i.e., for panel or workpiece 19) and X-Y translation/θ rotation stage 20 (detailed in FIG. 5); and a beam delivery breadboard 22 (e.g., as shown in FIG. 4a), mounted in a gantry support system 24 supporting first, second and third carriage mounted fiber positioning stages 25a, 25b and 25c, comprises the top level 26. Deriving power and control signals from the remotely positioned control system (shown in FIG. 2), patterning head 10 provides the production environment framework within which holographic pattern generation requirements can be met. In particular, there is a requirement for isolating the laser beam paths 27a, 27b, 27c and the recording plane (e.g., the upper surface 28 of workpiece 19) from vibrations due to excessive air flow, mechanical equipment vibrations, acoustic noise and any other ambient source of vibration. Vibration isolation is provided for all three levels 12, 16 and 26 in patterning head 10 using four vertical pneumatic passive damping supports 30. Pneumatic supports or isolators 30 float the patterning head 10 on compressed air. To attenuate vibrations from air currents and airborne acoustic noise, both the laser source walls 31 and the patterning chamber walls 32 are enclosed using aluminum or stainless steel skinned, foam core panels typical of modern clean room wall coverings. Patterning head 10 is tethered (to the control tower and heat exchanger support equipment shown in FIG. 2) by the laser umbilical and a second cable bundle containing vacuum and electrical control lines.

Patterning head 10 includes a patterning chamber 34 enclosed by four patterning chamber walls 32 and a chamber lid 36. Patterning chamber 34 can be sealed and, when sealed, is optically enclosed or light tight. Mutually coherent laser beams shine downwardly from the fiber positioning stages 25a, 25b, and 25c, along the laser beam paths 27a, 27b, 27c, and are aimed toward panel mount 18 which acts as a platform to support a workpiece to be subjected to the holographic lithography process of the present invention. An aiming point 38 on the panel upper surface 28 is approximately at the center of the laser beam paths 27a, 27b, 27c.

Figure 2:
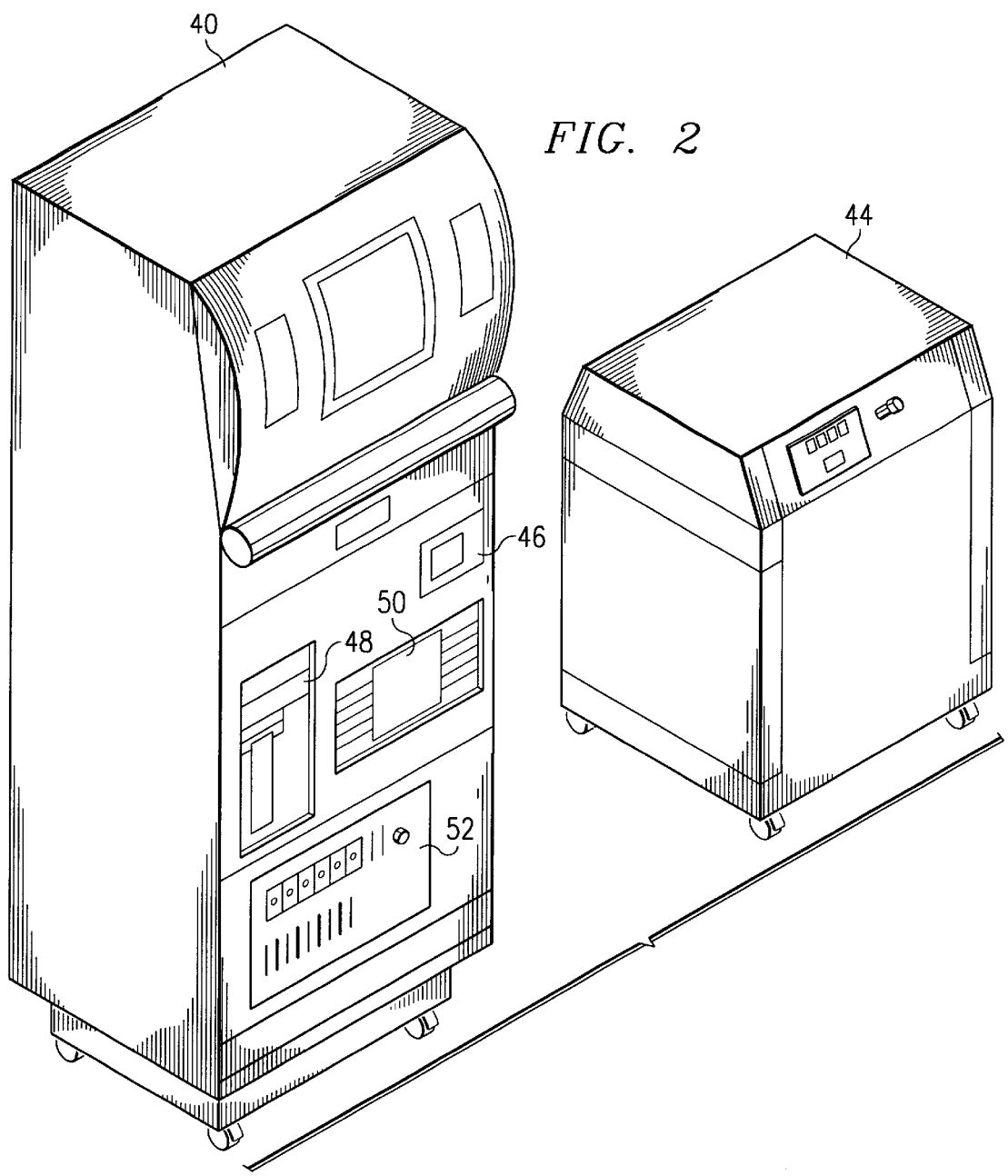
FIG. 2 is a perspective view in partial cross section of the tool system remote control tower and water-to-water heat exchanger.

FIG. 2 illustrates support equipment included in the tool system for use with patterning head 10. Patterning head 10 (FIGS. 1a, 1b) is controlled using a control system 40 including a personal computer 48, having a processor and a memory, that interfaces with the driving electronics, directs the patterning sequence, and monitors the tool system status. The laser source 14 (FIGS. 1a, 1b) is temperature controlled via a stand-alone water-to-water heat exchanger 44. A conventional electric air compressor (not shown) provides the requisite compressed air for the pneumatic table isolation supports 30 (FIGS. 1a, 1b). Control system 40 also includes an exposure energy meter 46 for measuring and indicating the holographic exposure energy, shutter drivers (and control relays) for controlling timing of the panel exposure and a stepper motor controller 50 for controlling the electric stepper motors used to position stage 20 (FIGS. 1a, 1b) upon which the panel mount 18 rests within the patterning chamber 34. Control tower 40 is also used to house power supply 52 for laser illumination source 14.

FIG. 3 is an overhead plan view of the platform containing an embodiment of a laser source 14' and represents an optical diagram, drawn approximately to scale, showing the free-space laser beam path, conventional beam splitting and directing optics, fiber optic coupling connectors, cables and the optomechanical hardware for mounting and aligning the optics and fiber optic cables. The laser depicted is an argon-ion gas laser 60 generating a polarized, single-frequency (or optically a single-line) beam with a wavelength of 457.9 nanometers, in the blue range of the visible spectrum. As noted above, the choice of this wavelength contributes to the large field-size, flexible beam delivery, and enhanced illumination uniformity advantages of the tool system of the present invention. Although illustrated as laser source 60, the tool system may utilize any suitable optical source to generate optical signals for use in interference lithography. In a particular embodiment, laser source 60 initially generates a free-space laser beam having a linear polarization vector. As discussed below, the tool system may incorporate an automated polarization vector alignment technique to achieve and maintain optimal interference contrast. This is achieved by aligning the polarization vector for each beam at an angle such that the overlap of polarization vectors is maximized in the plane of the wafer or workpiece.

Laser source 60 generates a coherent light source beam directed through a sequence of first and second turning motors 62, 64, and then to a set of one, two or three beam splitters dividing the single beam into two, three or four equal portions, respectively. As noted above, the patterning tool of the present invention can include two, three or four laser beams. In the embodiment of the laser source 14' shown in FIG. 3, four substantially equal and mutually coherent laser beams are produced by use of first second and third successively positioned beam splitters 66, 68 and 70. As is well known in the art, a beam splitter reflects a portion of an incident laser beam and allows the remainder to pass through; so, as shown in FIG. 3, a portion of the coherent light source beam incident upon beam splitter 66 is reflected at an acute angle toward a first electronic shutter 72 (which is in an open, light transmissive state) and on through first waveplate 74 and is launched into the first flexible fiber optic patch cord 76 via a connectorized mounted fiber positioning stage 78. The light passed through beam splitter 66 is received by beam splitter 68. In similar fashion, the reflected energy from second beam splitter 68 is transmitted through second electronic shutter 80 (when in the open, light transmissive state), through second waveplate 82 and is launched into second flexible fiber optic patchcord 84 via second connectorized mounted fiber mounted fiber positioning stage 86. Likewise, the light passed through beam splitter 68 is received at beam splitter 70. The reflected energy from third beam splitter 70 is transmitted through third electronic shutter 90 (when in the open, light transmissive state), through third waveplate 92 and is launched into third flexible fiber optic patchcord 94 via third connectorized mounted fiber positioning stage 96. Finally, light transmitted through third beam splitter 70 is reflected from a third turning mirror 98, is transmitted through fourth electronic shutter 100 (when in the open, light transmissive state), through fourth wavelength 102 and is launched into fourth flexible fiber optic patchcord 104 via fourth connectorized mounted fiber positioning stage 106.

Figure 7A:
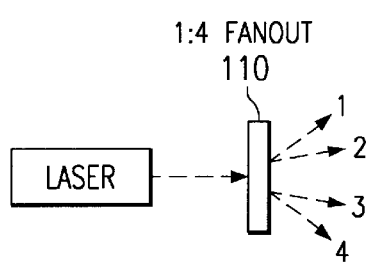
FIG. 7a shows a compact 1:4 fanout structure for dividing a single light source into four sources.
Figure 7B:
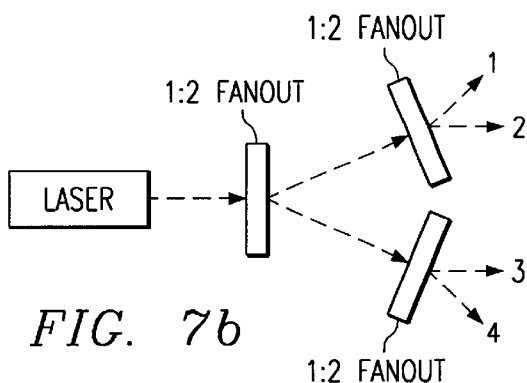
FIG. 7b shows a compact fanout structure using three 1:2 fanouts, for dividing a single light source into four sources.
Figure 7C:
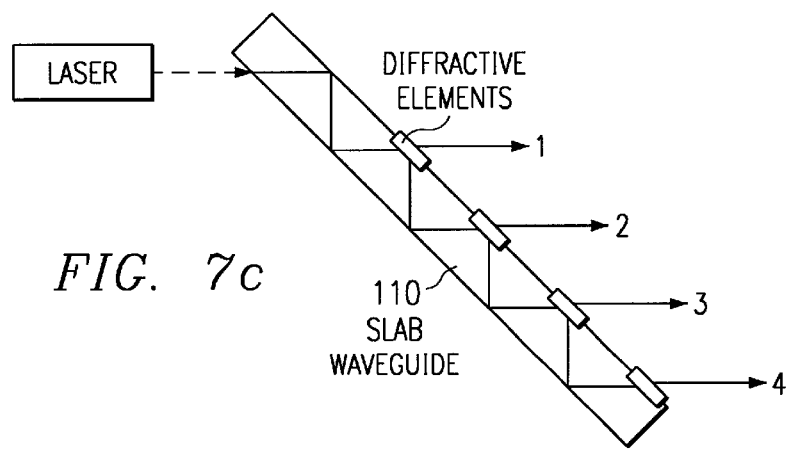
FIG. 7c depicts a grating-coupled frustrated total internal reflection (FTIR) device for dividing a single light source into multiple sources.
Figure 7D:
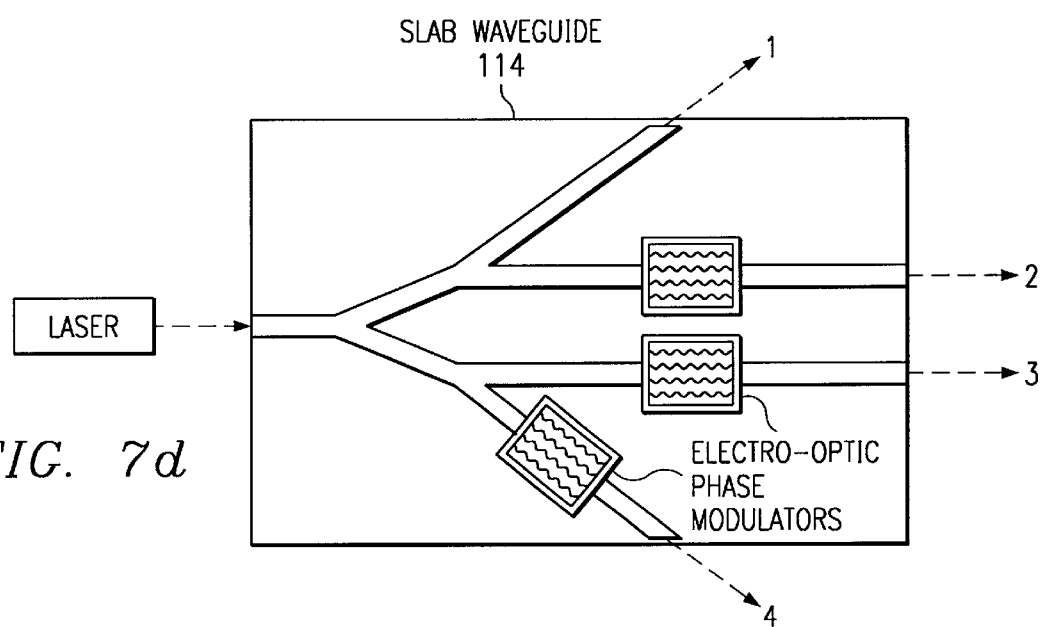
FIG. 7d depicts an integrated optic waveguide structure employing mode cross coupling for dividing a single light source into multiple sources.

The beam splitters 66, 68, and 70 serve to divide the coherent light source beam into first, second, third and fourth mutually coherent optical beams. As shown in FIGS. 7a, 7b, 7c and 7d, there are a number of alternatives for dividing the source beam. In alternative embodiments, the source beam is divided upon being directed through a diffractive one-to-four fanout 110 as shown in FIG. 7a, through serially arrayed one-to-two fanouts as shown in FIG. 7b, through a grating coupled frustrated total internal reflection device (FTIR) 110 (comprised of a slab waveguide with spaced diffractive elements) a shown in FIG. 7c, or a mode cross-coupling integrated optic waveguide divider 114 (including a slab waveguide with branching trees and optical electro-optic phase modulators) as shown in FIG. 7d, to generate the four beams desired.

Waveplates 74, 82, 92, and 102 (generally referred to as waveplates 74) may be half waveplates that are adjustable to change the orientation of the linear polarization vector of the optical signal prior to coupling to the fiber optical cable 76, 84, 94, and 104 (generally referred to as cables, waveguides, or fibers 76). Waveplates 74 may adjust the linear polarization vector of the optical signal in a passive manner using a birefringement material, in an active manner using an electro-optical half waveplate, or in any other suitable manner that allows waveplate 74 to adjust the linear polarization vector. More generally, tool system may incorporate any device, equipment, or technique that is capable of adjusting the linear polarization vector of the optical signal.

The four beams are then incident upon fiber optic cables 76, 84, 94, 104 (FIG. 3) fitted at the proximal end with pre-aligned, collimator-type fiber coupling connectors included in the respective mounted fiber positioning stages 78, 86, 96, 106. Once launched into and contained by the flexible fiber optic patch cords, the beams are easily manipulated simply by moving the fiber optic patch cords. The fiber optic cables 76, 84, 94, 104 are directed through an access hole in the translation stage table and then up along the gantry support posts to the beam delivery breadboard level, as shown in FIG. 4b.

Figure 4B:
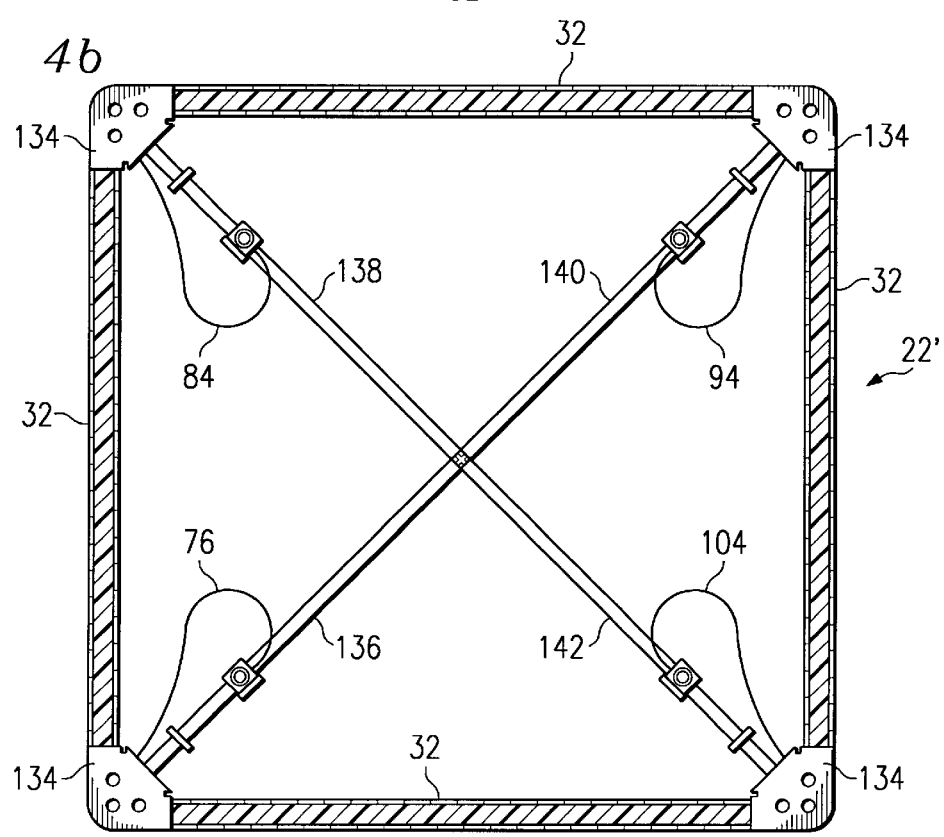
FIG. 4b is an overhead or plan view of the beam delivery breadboard with associated rails for the four beam delivery system.

FIGS. 4a and 4b are overhead views of two embodiments of the laser beam delivery breadboard. The three beam embodiment of FIG. 4a corresponds to the patterning head embodiment 10 of FIGS. 1a and 1b. The four beam embodiment of FIG. 4b corresponds to the laser source embodiment 14' illustrated in FIG. 3. For both embodiments, each fiber optic cable distal end is mounted on a two axis mechanical gimbal, which in turn is mounted on a carriage type base. The carriages can be manually (or via optional automation) positioned along the length of rails; carriage position defines the range of pattern feature size and pattern feature spacing. Graduated stops along the calibrated rail system are located at commonly selected positions. Gantry support system 24 is illustrated in FIG. 4a and includes a planar support beam delivery breadboard 22 affixed to four vertical granite columns or stanchions 134. A three beam rail system 118 is bolted to gantry support system 24 and includes first, second and third equal length rails 120, 122 and 124, radially spaced in a common plane and affixed to one another in a center rail connection hub 128 disposed near the center of the patterning chamber 34. Rail graduation markings 126 are used to position the carriage mounted fiber positioning stages 25a, 25b, 25c, which are preferably positioned at equal distances from the center rail connecting hub 128, as can be seen by use of the imaginary reference lines 130 included in FIG. 4a. Patterning chamber walls 32 can be seen in cross section, as well as the four corner granite stanchion supports. 134. The four rail embodiment of the rail system is shown in FIG. 4b and includes first, second, third and fourth rails 136, 138, 140 and 142, respectively, arrayed in a common plane and radially spaced and affixed to one another at the center of the chamber 34' in a center rail connection hub 144; this embodiment also includes patterning chamber walls 32 and the four corner granite stanchion supports 134, as above. For the embodiments of FIG. 4a or FIG. 4b, the entire breadboard (e.g., 22 of FIGS. 1a and 4a) is supported at the four corners by precision machined vertical granite stanchions 134. Laser beams emanating from the fiber optic cable distal ends are directed downwardly towards the translation stage/panel mount level, as discussed above.

Figure 5:
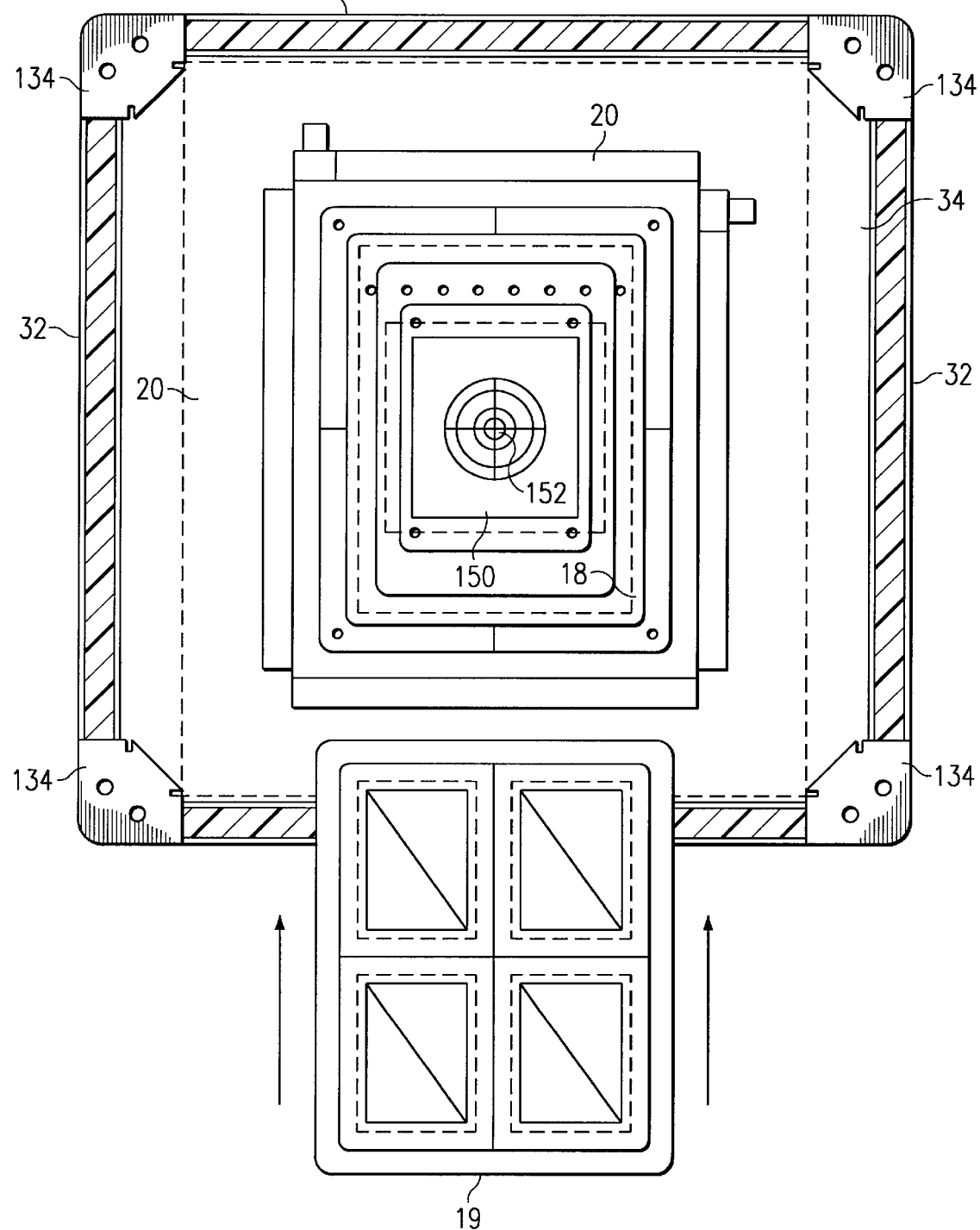
FIG. 5 is an overhead or plan view of the recording plane translation stage and substrate mounting system, or chuck; also depicted is a maximum-size substrate with a typical pattern area.

FIG. 5 is an overhead view of the translation stage level 16 depicting the range of travel or translation for stage 20 and the panel mount 18 including a vacuum chuck 150. In the embodiment illustrated, vacuum suction force for the chuck 150 is controlled in zones by computer 48; a variety of vacuum control schemes permits accommodation of a variety of panel sizes, up to a maximum of 650 by 550 millimeters. Larger panels can be accepted with simple changes in the scale of the tool and chuck 150. Chuck temperature can be maintained under computer control. The chuck 150 incorporates a panel lift feature to facilitate the automated panel loading and unloading, and a beam power detector 152 is at the aiming point 38 (e.g., as FIG. 1a) and integrated below the chuck surface for automated exposure metering.

The illumination system of the present invention is schematically illustrated in FIG. 6a which shows a flexible, shifted four-beam illumination architecture. FIG. 6b schematically illustrates a three-beam embodiment. As discussed above, the beam from laser source 14 is divided, in any of the manners described herein, and launched into fiber optic cables at the cable proximal ends (e.g., at the mounted fiber positioning stages 78, 86, 96 and 106). Coupling of laser light into single-mode, polarization maintaining fiber (optical waveguide) has traditionally been a difficult task due to the small fiber core diameters—typically in the two to four micron range. Recently, however, fiber optic cable manufacturers have been "connectorizing" cable products with mechanical mounting hardware and optics, usually for collimating the light emanating from the fiber ends. However, in the present invention, a typical fiber collimator is operated in a reverse sense, whereby nearly collimated laser light is coupled into the fibers at the fiber proximal ends (e.g., at the mounted fiber positioning stages 78, 86, 96 and 106), whereupon the alignment tolerances for launching light into the fiber are greatly increased and coupling stability is vastly improved. These advantages, together with the flexible nature of the fiber cables, make fiber cables well suited for use in the manufacturing tool of the present invention.

Another technical advantage obtained by employing fiber optic cables is the ability of fiber optic cables to replace the function of conventional spatial filters used in laboratory setups. The act of coupling the laser light into the fiber cable eliminates amplitude noise in the beams, and produces highly divergent beams as a result of the confinement of the light within the small diameter fiber core. The highly divergent beams emanating from the ends of fiber cables, as shown in FIGS. 6a and 6b, have a high numerical aperture. The fibers are cut to lengths which allow the optical path lengths to be set equal, thereby allowing the laser to operate at an increased power level afforded by the presence of multiple longitudinal modes, or, using industry terminology, single-line operation. Connectorized on the distal end of each fiber, an optical element 160 (i.e., a conventional refractive lens) can be employed to optimize the divergence of the illuminating beams illuminating the workpiece. However, in one embodiment, optical element 160 is a conventional diffusing element imparting both phase and amplitude noise or aberration which, in conjunction with the highly divergent beam emanating from the fiber distal end, tailors the phase noise. As discussed above, this combination yields precise control over the illuminating beam divergence without the unacceptable spatial noise as is typically found when using diffusers. The advantageous combination of a fiber optic waveguide and a phase aberrating diffuser modifies the resulting illumination beam, thus averaging out the spatial noise and reducing errors in the resulting holographic pattern. Optical element 160 may be a diffuser having a diffusing angle in the range of 5°–40° (uniform or Gaussian) and selected to optimize microscopic feature uniformity. Alternatively, optical element 160 can be a mirror including diffusing and enlarging surfaces, employed in a reflective-mode operation. In the three-beam embodiment of FIG. 6b, the cable distal ends 164 are located in a common plane 166 and in a triangle arrangement; the recording plane 168 is located at a fixed distance (e.g., greater than one meter) from and parallel to the common plane 166 defined by and containing the cable distal ends 164. Alternatively, with four beams as shown in FIG. 6a, the cable distal ends 164 define and are positioned in a planar square grid 170. The arrangements of FIGS. 6a and 6b produce a two-dimensional interference pattern which can be observed at the recording plane 168.

The recording plane 168 coincides with the plane containing the intersecting beam centroids (i.e., the plane defined by the point of intersection of the centers of the three or four illuminating beams). FIGS. 6a and 6b also show the shifted illumination technique of the present invention by which the beam centroids are displaced from the recording plane 168, but instead intersect in a shifted or offset plane 172 located five to ten centimeters above and parallel to the recording plane 168. Because the intensity of the light emerging from the fiber optic cable distal ends 164 is greatest at the beam center and decreases along a beam radius with a nearly Gaussian distribution, angularly displacing the three (or four) illuminating beams allows for a more uniform illumination at a recording plane 168 vertically offset (e.g., by five to ten centimeters) from the beam centroid overlap plane 172.

FIG. 6c illustrates a number of holey fibers that provide particular advantages in the tool system. Specifically, these holey fibers include a micro-arrayed structure of air holes running along the length of the fiber. The micro-array could also consist of holes of another material besides air or have another shape besides circular. The core region in holey fibers includes a defect, discontinuity, or other variation (generally referred to as a defect) in the axially formed holes. Light confinement to the core region occurs due to photonic bandgap (PBG) effects, an effective volume refractive index effect, or a combination of these effects. Holey fibers may include a single, non-doped homogenous material, such as silica, that provides light confinement characteristics by the arrangement and size of axially formed holes.

In PBG holey fibers, light remains in the lower index core region due to PBG effects created by the surrounding micro-array of holes in the cladding region. The refractive index of the core region may be lower than the cladding region since total internal reflection is not required. In effective index holey fibers, the air hole micro-array in the cladding region creates a volume refractive index that is lower than that of the core region. Thus, light travels in the core region, at least in part, by total internal reflection as in standard fiber. Certain holey fibers may benefit from both PBG effects and volume refractive index effects to guide the light in the core region. Holey fibers, through the arrangement and size of the axially formed holes, may also exhibit enhanced polarization maintaining characteristics.

The advantages of holey fibers in the tool system are numerous. Holey fibers may exhibit single mode characteristics over a much larger range of wavelengths than standard fiber. The single mode core may be smaller than a standard fiber core, which allows light to diverge faster as it exits the fiber, and may eliminate the need for optical element 160 or any other intervening optics. This allows the fiber output to be placed closer to recording plane 168 to maintain a flat, central portion of the Gaussian beam intensity distribution across the exposure area. A wider divergence or larger numerical aperture also reduces the overall footprint of the tool system. Coupling efficiency into holey fibers improve since a smaller core results in a larger numerical aperture and resulting acceptance angles. Holey fibers operating using PBG effects are less susceptible to stress and tight bends in the fiber delivery system that, in traditional fibers, may result in loss of optical energy and changes in the polarization of the optical signal. Holey fibers may also exhibit significantly higher polarization extinction ratios that allow an optical signal having a linear polarization vector launched into the holey fiber along a polarization axis to maintain the orientation of the linear polarization vector throughout the fiber length. These fibers with large polarization extinction ratios are less susceptible to stress and tight bends along the length of the fiber that, in traditional fibers, may cause a linearly polarized input optical signal to exit from the fiber with a partially elliptical polarization. For example, a holey fiber may receive a linearly polarized optical signal aligned to a fast axis of polarization of the fiber, and communicate this signal to the output of the fiber, where the emitted optical signal includes little or no component of the optical signal in a slow axis of polarization perpendicular to the fast axis.

Referring again to FIG. 6c, fiber 300 includes axially formed holes 302 of similar size and consistent spacing. Since fiber 300 does not include a defect in the axially formed holes, it exhibits neither PBG effects nor volume refractive index effects to guide light. Fiber 310, however, includes a defect 312 that is an absence of axially formed holes in the core region surrounded by axially formed holes of a similar size and spacing in the cladding region. This missing hole defect may produce both PBG effects and provide an effective index for guiding the optical signal through the core region of fiber 310. For example, using a nominal index of refraction for glass of 1.5 and air of 1.0, fiber 310 depending on the particular spacing and size of holes may exhibit an effective index in the cladding region of approximately 1.2, and an effective index in the core region of approximately 1.5. As such, fiber 310 directs the optical signal through the core region using, at least in part, total internal reflection. Fiber 320 illustrates an alternative defect formed by axially formed holes 322 in the core region that are smaller in diameter than axially formed holes 302 in the cladding region. Again, fiber 320 may exhibit both PBG effects and volume refractive index effects to guide the optical signal through the core region. In one particular example where fiber 320 is formed of homogenous, undoped glass and holes 302, 322 contain air, the effective index of the core region having smaller holes 322 may be approximately 1.4, whereas the effective index of the cladding region having larger holes 302 may be approximately 1.2.

The defect formed in fiber 330 is a centrally aligned hole 332 surrounded by axially formed holes 302 in the cladding region. Centrally aligned hole 332 has a larger cross section than axially formed holes 302 and allows fiber 330 to direct the optical signal through the core region using PBG effects. As a result, fiber 330 is less susceptible to radiation losses and degradation of polarization due to stresses and bends in fiber 330. To enhance polarization maintaining characteristics, fiber 340 includes a similar centrally aligned hole 332, but varies the arrangement and size of axially formed holes in the cladding region to develop one or more polarization maintaining axes. In this particular embodiment, fiber 340 includes smaller axially formed holes 342 arranged vertically in the cladding region with larger axially formed holes 344 arranged elsewhere. By including both a defect in the core region and a specific arrangement and size of axially formed holes, fiber 340 exhibits both PBG effects as well as polarization maintaining characteristics. Fiber 350 illustrates an alternative embodiment for establishing a polarization maintaining axis in a PBG holey fiber. In this example, instead of a centrally aligned circular hole, fiber 350 includes an elliptical hole 352 designed to provide asymmetry in establishing a polarization maintaining axis.

Although FIG. 6c illustrates a number of potential embodiments of holey fibers, the tool system may adopt any suitable form or arrangement of a holey fiber that establishes a defect in its core region by some suitable arrangement, change in size, or variations in axially formed holes having a circular, elliptical, or other suitable cross-sectional shape. Furthermore, axially formed holes may include air, doped glass, or other suitable material to enhance the PBG, effective index, or polarization maintaining characteristics of the fibers.

Figure 8A:
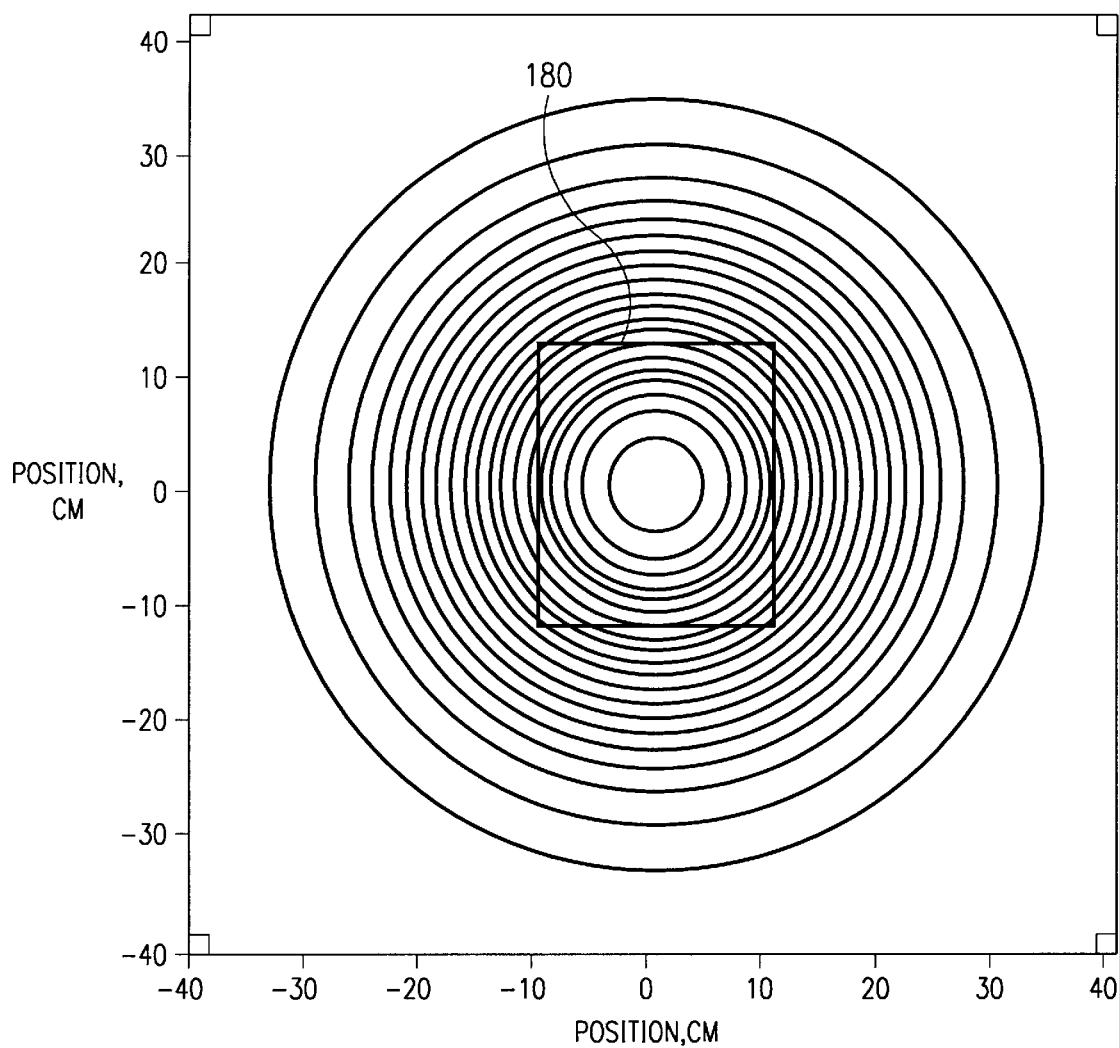
FIG. 8a is a computer generated contour plot of intensity distributions for a tool system not employing shifted three-beam illumination; superimposed on the plots is a rectangle representing the screen area of a typical 300 millimeter diagonal display.
Figure 8B:
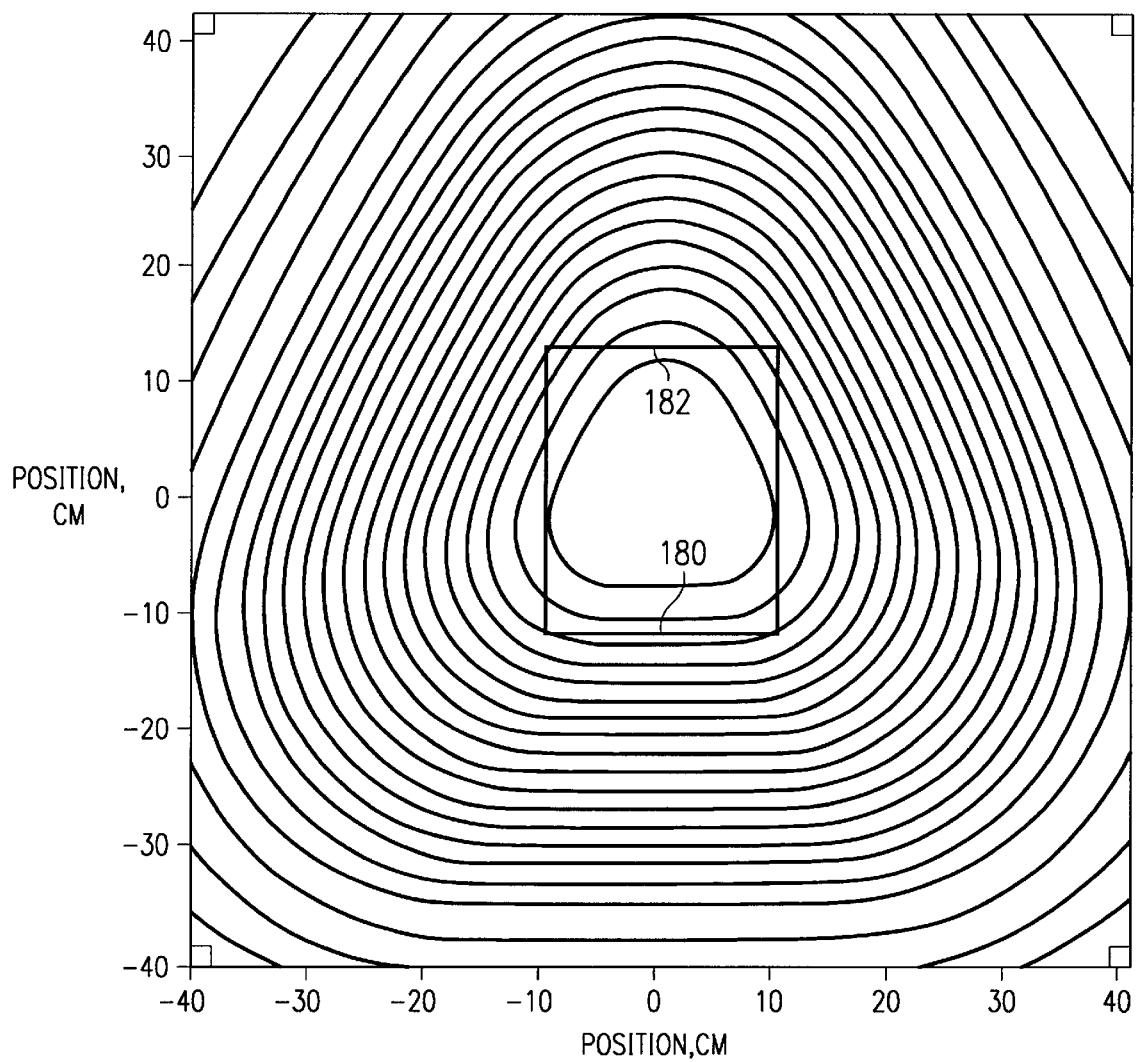

FIGS. 8a and 8b represent the macroscopic intensity distribution resulting from overlapping three illuminating beams. On this macroscopic scale, the intensities of the three beams are summed and the resulting distribution is represented in a contour plot where each successively outer ring represents a drop of five percent from the next interior or higher intensity. Also plotted in the figures is a rectangle 180 representing a two hundred fifty by two hundred millimeter area corresponding to a three hundred millimeter diagonal screen area suitable for FED patterning. In the plots of FIGS. 8a and 8b the divergence of the illuminating beams is fixed. FIG. 8a depicts the illumination found in the shifted or offset plane 172 (FIG. 6b) where all three beam centroids overlap. In this case the resulting intensity distribution varies with the expected Gaussian profile yielding a 50% variation in the level of the illumination within the rectangular target field 180. This directly impacts the feature size recorded in photoresist, yielding a comparable and unacceptable feature size variation over the exposed area. One solution to this problem would be to further expand the size of the illuminating beams, however this becomes impractical at existing laser power levels and would lead to long exposure times and poor tool manufacturing throughput. In the method of the present invention, the illuminating beam centroids are axially displaced, thereby shifting the beam centroid overlap plane away from the recording plane and effectively broadening the area of low variation illumination, the results of which are depicted in FIG. 8b, again for a fixed beam divergence. The plot of FIG. 8b represents the illumination in a recording plane 168 axially offset or shifted some distance from the plane 172 in which the beam centroids overlap; an apparent displacement of each of the three illuminating beams is observed. Note that a more acceptable maximum variation of only 15% in illumination level is found in the corners 182 of the rectangular target field 180. The optimum shift in this illumination model was eighteen centimeters measured along lines radiating out from the center to the corners of an isosceles triangle, and the Gaussian beam diameters in the plane are nearly sixty centimeters, providing ample beam overlap as is necessary for generating the microscopic interferometric patterns.

Holey fibers that exhibit PBG and effective index effects may have a smaller core that significantly reduces intensity variation across rectangular target field 180. As discussed above, smaller core holey fibers have larger numerical apertures and emit optical signals with a central portion of the Gaussian beam intensity distribution spread out more evenly across the exposure area. The use of holey fibers, alone or in combination with an axially offset recording plane 168, significantly reduces feature size variation over the exposed area.

Figure 9:
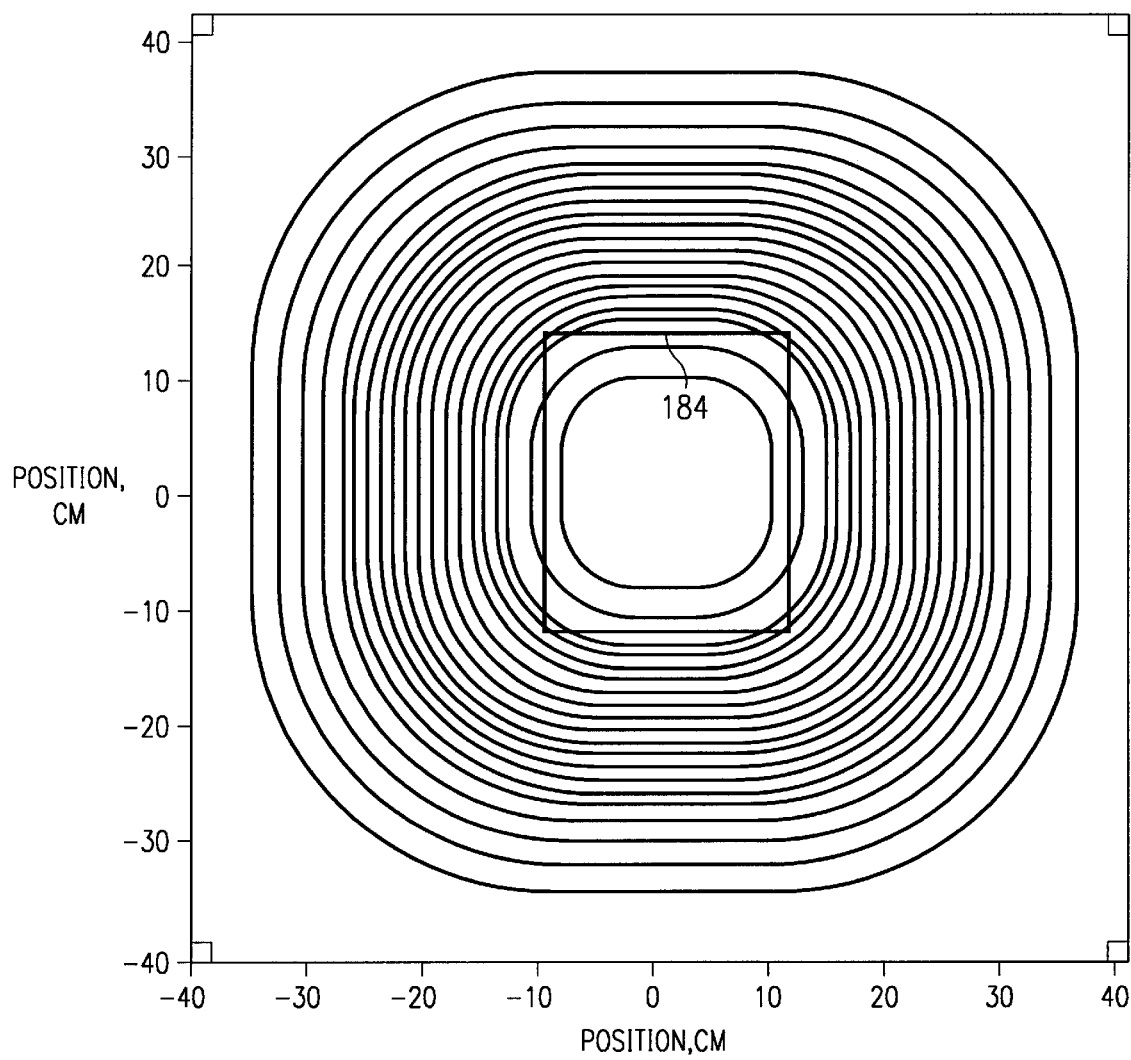
FIG. 9 is similar to FIG. 8b but illustrates the intensity distributions plotted for a four-beam tool system having shorter displacement and a lower beam divergence.

FIG. 9 depicts the plotted experimental results (also as illumination intensity contours over an area) for the shifted illumination technique of the present invention utilizing four illuminating beams, as in FIG. 6a. Comparing the plots of FIG. 8b to FIG. 9, it is evident in FIG. 9 that good illumination uniformity over the rectangular target 184 is more readily obtained with four beams, yielding lower beam divergence and smaller displacements. The illumination intensity contour curves plotted in FIG. 9 are for a four-beam system incorporating an offset or shift of only ten centimeters with illuminating beam diameters one-third smaller than those for which results are depicted in FIG. 8b. The lower beam divergence yields a more concentrated illumination and consequently shorter exposure times and higher tool manufacturing throughput.

From the foregoing description it will be appreciated that the invention makes available a tool and method for holographic lithography well suited for use in manufacturing environments, the embodiments disclosed herein are examples and many variations are possible. For example, arrays of lines suitable for grating or electrode applications may be obtained by utilizing two or three illuminating beams. Such patterns may also be useful in forming alignment layers for liquid crystal-based devices and displays. Asymmetric placement of the illuminating beams (e.g., by asymmetric placement of the carriage mounted fiber positioning stages 25a, 25b, 25c on rails 136, 138 and 140) can generate a variety of sub-micron sized structures having rectangular or oval shapes and suitable for phase shifting optics or for patterning more arbitrarily shaped structures for integrated circuit applications. Because the microscopic interference patterns exist wherever the illuminating beams overlap, the patterning system can also be used to generate periodic structures on arbitrarily shaped surfaces such as missile domes, aircraft canopies, and curved refractive optics.

As noted above, a variety of products could benefit from the increased ruggedness and anti-reflective performance afforded by motheye surfacing over large areas. A partial list includes applications such as automobile or aircraft windows, protective or anti-glare screens for artwork or displays, eye or sun glasses, residential or commercial windows, imaging systems such as cameras, telescopes, microscopes, and binoculars, as well as photocells for use in optical sensing, optical data transmission and energy gathering. In addition, motheye surfaces find application in the diamond film industry where increased surface area may enhance the adhesion of the diamond layers, and the surface structures themselves may provide a greater density of diamond nucleation sites yielding a more uniform film coating.

Figure 10:
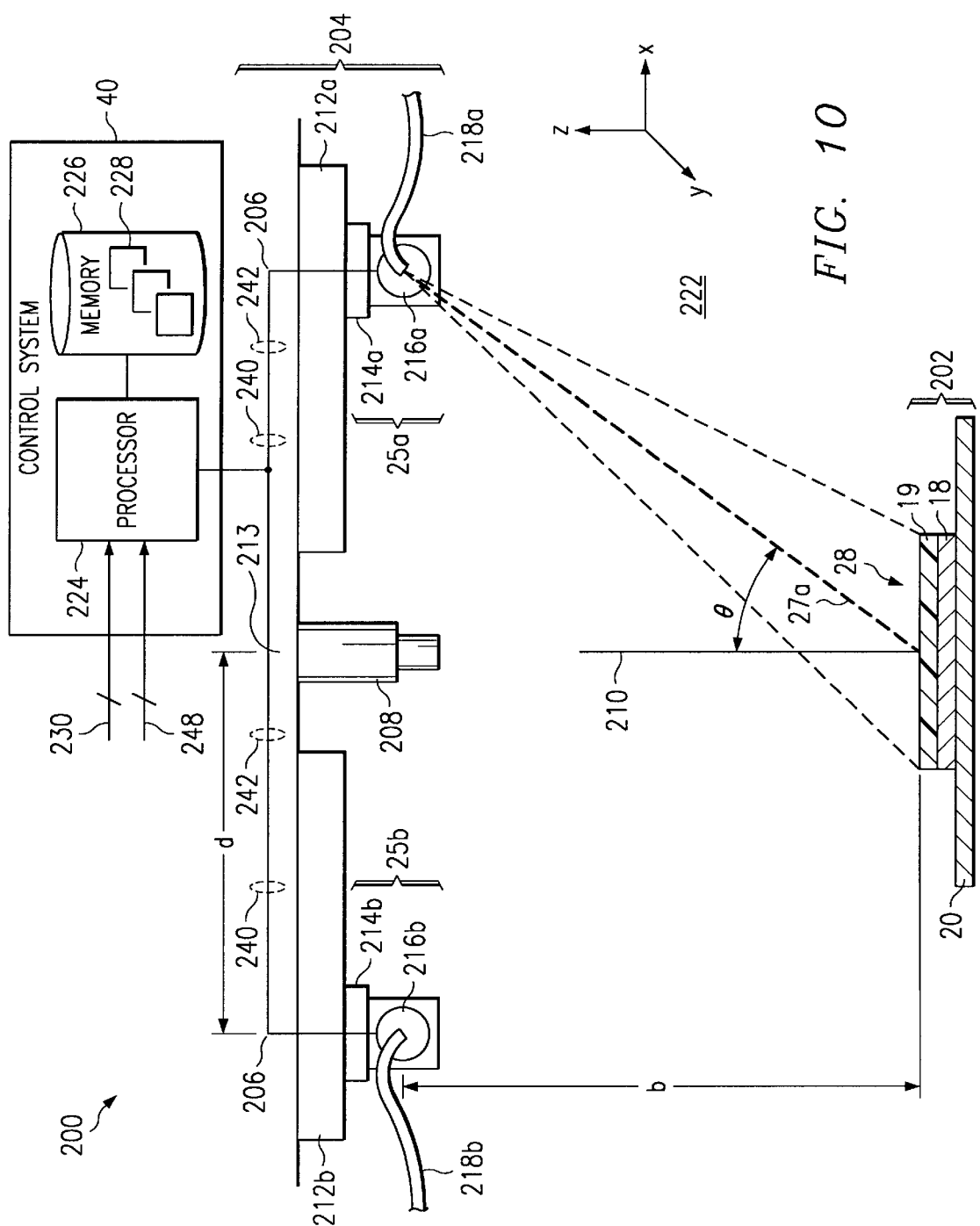
FIG. 10 illustrates one embodiment of an interference lithography tool in accordance with the present invention.

FIG. 10 illustrates one embodiment of an interference lithography tool system 200 that includes a patterning platform 202, a positioning device 204, and control system 40 coupled to positioning device 204 using communication paths 206. Although system 200 further includes appropriate components of patterning head 10 described above, the following description of system 200 is detailed with respect to the arrangement and operation of patterning platform 202, positioning device 204, and control system 40. Although FIG. 10 illustrates a two-beam configuration for system 200, it should be understood that system 200 also includes a three-beam and a four-beam configuration. In general, system 200 generates a particular interferometric pattern of light on workpiece 19 using a plurality of exposure beams 27. Control system 40 adjusts the translational and rotational positioning of various components of the patterning device 204 to achieve a particular grating period for the interferometric pattern of light.

Platform 202 includes panel mount or wafer chuck 18 coupled to X-Y translation/θ rotation stage 20. Workpiece 19 is coupled to wafer chuck 18. The upper surface of the workpiece 19 forms a recording plane 28, also referred to as a wafer plane, where the interferometric pattern of light is formed. A plane 210 extends perpendicular to the recording plane 28.

Positioning device 204 includes positioning stages 25a and 25b coupled to linear rails 212a and 212b, respectively. Linear rails 212a–b are colinear and formed in a common plane symmetrically positioned about a central point 213. In general, the center of workpiece 19 is positioned below central point 213. In a particular embodiment of system 200, positioning device 204 further includes a camera 208. Camera 208 comprises a charge coupled device camera that measures the intensity distribution of exposure beams 27 on recording plane 28. Each positioning stage 25 of positioning device 204 comprises a carriage device 214 and a rotary stage 216. Optical fibers 218a and 218b couple to rotary stages 216a and 216b, respectively, such that the distal ends of fibers 218 are positioned a distance, b, from the recording plane 28 of workpiece 19. The proximal ends of optical fibers 218 generally couple to a light source, as described above with respect to FIG. 3. The distal ends of fiber 218a and 218b emit exposure beams 27a and 27b, respectively.

In general, a rotary stage 216 adjusts the propagation angle, θ, measured with respect to plane 210, at which a corresponding exposure beam 27 contacts recording plane 28 of workpiece 19. A carriage 214 translates a corresponding rotary stage 216 along a corresponding rail 212 such that the distal end of a corresponding fiber 218 is positioned a distance, d, from central point 213. Exposure beams 27 propagate through a refractive medium 222, such as air, that has a particular index of refraction, n. Exposure beams 27 comprise visible light, infrared radiation, ultraviolet radiation, or any other suitable optical beam propagating at any suitable wavelength. By manipulating the propagation angle, θ, and distance, d, system 200 can generate an interferometric pattern of light having a particular grating period.

Control system 40 comprises a computer 48 having a processor 224 and a memory 226, as described above with regard to FIG. 2. In operation of system 200 in a two-beam configuration, memory 226 stores in files 228 the current distance, d, and propagation angle, θ, for each of fibers 218a–b and exposure beams 27a–b. Processor 224 receives an input 230, indicating a particular grating period for the interferometric pattern of light to be generated on workpiece 19. Processor determines the propagation angle, θ, and the distance, d, necessary to achieve the particular grating period indicated by input 230, according to the following two-beam configuration equations:

$$(1) \quad \Lambda = \frac{\lambda}{(2n\sin\theta)}$$

where:
Λ=period indicated by input 230;
λ=wavelength of exposure beams 27;
n=index of refraction of incident medium (n=1 for air); and
θ=half-angle between exposure beams 27.

$$d = b \tan\theta \quad (2)$$

where:
d=distance between distal end of fibers 218 and center of rails 212;
b=distance between distal end of fibers 218 and recording plane 28 of workpiece 19; and
θ=half-angle between exposure beams 27, calculated in equation (1) (angle between chief ray and normal to wafer plane in medium 222).

Upon determining the appropriate position values for exposure beams 27, including propagation angle θ, and distance d, processor 224 generates a translational control signal 240 in response to the calculated distance, d, and an angular control signal 242 in response to the calculated propagation angle, θ. In one embodiment, processor 224 determines signals 240 and 242 based upon the difference between the calculated values of propagation angle θ and distance d, from equations (1) and (2), and the values for propagation angle θ and distance d stored in memory 226.

Each carriage 214 translates a corresponding fiber 218, and associated exposure beam 27, along a corresponding rail 212 in response to the translational control signal 240. Each rotary stage 216 rotates a corresponding fiber 218, and associated exposure beam 27, in response to angular control signal 242. The angle which stage 216 is rotated is such that the chief ray (center of the cone of beam 27 emanating from a fiber 218) remains centered on wafer plane 28. In this respect, system 200 receives as input 230 a particular grating period for an interferometric pattern of light to be generated, and automatically positions fibers 218 in an appropriate translational and rotational manner.

In operation of system 200 in a three-beam configuration, system 200 further includes the appropriate additional components of positioning device 204, such as a third positioning stage 25c, and fiber 218c emitting a third exposure beam 27c. Third positioning stage 25c is coupled to a third linear rail 212c that is arranged in a suitable manner with respect to linear rails 212a–b to achieve the appropriate three-beam interferometric pattern of light. In one embodiment, linear rails 212a, 212b, and 212c are placed one-hundred twenty degrees apart from each other in the X-Y plane. Processor 224 determines the appropriate propagation angle, θ, and the appropriate distance, d, necessary to achieve the particular grating period of the three-beam inteferometric pattern of light, as indicated by input 230, according to the following three-beam configuration equations:

$$(1) \; \Lambda = \left(\frac{2}{\sqrt{3}}\right)\left(\frac{\lambda}{2n\sin\left[a\tan(\cos(30)\tan(\theta))\right]}\right)$$

where:

Λ=period indicated by input 230;

λ=wavelength of exposure beams 27;

n=index of refraction of incident medium (n=1 for air); and

θ=θ, angle between chief ray and normal to wafer plane.

$$d = b \tan(\theta) \quad (2)$$

where:

d=distance between distal end of fibers 218 and center of rails 212;

b=distance between distal end of fibers 218 and recording plane 28 of workpiece 19;

θ=angle between chief ray and normal to wafer plane calculated in equation (1).

Upon determining the appropriate position values for exposure beams 27, including propagation angle θ, and distance d, processor 224 generates a translational control signal 240 in response to the calculated distance, d, and an angular control signal 242 in response to the calculated propagation angle, θ. In one embodiment, processor 224 determines signals 240 and 242 based upon the difference between the calculated values of propagation angle θ and distance d, from equations (1) and (2), and the values for propagation angle θ and distance d stored in memory 226.

Each carriage 214 translates a corresponding fiber 218 along a corresponding rail 212 in response to the translational control signal 240. Each rotary stage 216 rotates a corresponding fiber 218 in response to angular control signal 242. In this respect, system 200 receives as input 230 a particular grating period for an interferometric pattern of light to be generated, and automatically positions fibers 218 in an appropriate translational and rotational manner.

In operation of system 200 in a four-beam configuration, system 200 further includes the appropriate additional components of positioning device 204, such as third and fourth positioning stages 25c and 25d, and fibers 218c and 218d emitting exposure beams 27c and 27d, respectively. Third positioning stage 25c is coupled to a third linear rail 212c and fourth positioning stage 25d is coupled to a fourth linear rail 212d. Linear rails 212c–d are arranged in a suitable manner with respect to linear rails 212a–b to achieve the appropriate four-beam interferometric pattern of light. In one embodiment, fibers 218 are located at the midpoints of a square (forming a cross-pattern) in the X-Y plane. Processor 224 determines the appropriate propagation angle, θ, and the appropriate distance, d, necessary to achieve the particular grating period of the four-beam interferometric pattern of light, as indicated by input 230, according to the following four-beam configuration equations:

$$(1) \; \Lambda = \frac{\lambda}{\sqrt{2}} n\sin\theta$$

where:

Λ=period indicated by input 230;

λ=wavelength of exposure beams 27;

n=index of refraction of incident medium (n=1 for air); and

θ=half angle between exposure beams 27 (angle between chief ray and normal to the wafer plane).

$$d = b \tan\theta \quad (2)$$

where:

d=distance between distal end of fibers 218 and center of rails 212;

b=distance between distal end of fibers 218 and recording plane 28 of workpiece 19; and θ=half-angle between exposure beams 27, (angle between chief ray and normal to wafer plane), calculated in equation (1).

Upon determining the appropriate position values for exposure beams 27, including propagation angle θ, and distance d, processor 224 generates a translational control signal 240 in response to the calculated distance, d, and an angular control signal 242 in response to the calculated propagation angle, θ. In one embodiment, processor 224 determines signals 240 and 242 based upon the difference between the calculated values of propagation angle θ and distance d, from equations (1) and (2), and the values for propagation angle θ and distance d stored in memory 226.

Each carriage 214 translates a corresponding fiber 218 along a corresponding rail 212 in response to the translational control signal 240. Each rotary stage 216 rotates a corresponding fiber 218 in response to angular control signal 242. In this respect, system 200 receives as input 230 a particular grating period for an interferometric pattern of light to be generated, and automatically positions fibers 218 in an appropriate translational and rotational manner.

A technical advantage of the present invention is that control system 40 controls the translational and rotational position of stages 25 to generate an interferometric pattern of light having a particular grating period, as indicated by input 230. In this regard, system 200 facilitates the rapid, repeatable, and accurate reconfiguration of the period for the interferometric pattern of light generated on workpiece 19.

In one embodiment of system 200, a closed loop feedback path is used to calibrate the operation of system 200. The closed loop feedback path comprises camera 208, control system 40, and positioning stages 25. Such a closed loop feedback path generally calibrates system 200 by (a) centering the exposure beams 27 upon workpiece 19; (b) maximizing the input coupling of fibers 218; (c) balancing the power density among the exposure beams 27; and (d) measuring the power density to determine the appropriate exposure time to achieve a desired exposure dose 248 of exposure beams 27.

To center the exposure beams 27 upon workpiece 19, camera 208 is pre-aligned so that the central pixels in the camera array images the center of the recording plane 28. Camera 208 measures the intensity distribution of exposure beams 27 contacting workpiece 19 at recording plane 28. Processor 224 determines the peak of the intensity distribution and the deviation of the peak from the center of workpiece 19. Based upon the deviation of the peak intensity distribution from the center of workpiece 19, processor 224 generates an appropriate angular control signal 242 for communication to positioning stages 25. Rotary stages 216 of positioning stages 25 rotate fibers 218 in response to signal 242. Camera 208, processor 224 and positioning stages 25 iteratively adjust the rotational position of fibers 218 until the peak intensity distribution of exposure beams 27 is approximately centered with respect to recording plane 28. This technique for centering exposure beams 27 may be performed to fine-tune beams 27 after the translational and rotational positioning described above.

To maximize the coupling of the light source into each fiber 218, camera 208 images workpiece 19 on a pixel-by-pixel basis, and measures the intensity of exposure beams 27 contacting recording plane 28. Processor 224 determines the sum of the pixel intensities from a sub-array of pixels in the central portion of the camera array. A fiber positioning stage of system 200, such as one of fiber positioning stages 78, 84, 96, and 106, is individually scanned over its range of motion while camera 208 continues to measure the intensity of the exposure beams 27. In this respect, a fiber 218 coupled to a fiber positioning stage is placed in a plurality of positions with respect to a light source When the intensity of exposure beams 27 measured by camera 208 is determined by processor 224 to be maximized for the sub-array of pixels in the central portion of the camera array, the maximum amount of the light source is generally coupled into a fiber 218 via the corresponding fiber positioning stage. Therefore, processor 224 generates positional control signals which maximize the intensity of exposure beams 27 in the recording plane 28. The fiber positioning stage places the fiber 218 in a particular position with respect to the light source in response to the position control signal. Each of the remaining fiber positioning stages of system 200 are thereafter individually scanned over its range of motion until the maximum sub-array pixel intensity is measured for each fiber 218. In this regard, the light source coupled into each fiber 218 is maximized.

To balance the power density among exposure beams 27, camera 208 images recording plane 28 of workpiece 19. An electronic shutter of system 200, such as one of the electronic shutters 72, 80, 90, and 100, is opened while the remaining shutters remain closed. In this respect, only the fiber 218 corresponding with the opened shutter receives light from a light source and emits an exposure beam 27. Camera 208 measures the intensity of the emitted exposure beam 27 contacting recording plane 28. Processor 224 determines the sum of the pixel intensities from a sub-array of pixels in the central portion of the camera array. The electronic shutter that is open is then closed, and one of the remaining shutters is opened. Camera 208 again measures the intensity of the emitted exposure beam 27 contacting recording plane 28. Processor 224 again determines the sum of the pixel intensities from a sub-array of pixels in the central portion of the camera array. In this respect, camera 208 measures a first intensity distribution associated with the first exposure beam 27 and a second intensity distribution associated with the second exposure beam 27.

If there is a difference between the sum of the pixel intensities determined for the first exposure beam 27 emitted by the first fiber 218 and the sum of the pixel intensities determined for the second exposure beam 27 emitted by the second fiber 218 then the power density among exposure beams 27 is unbalanced and processor 224 generates a beam balance control signal based upon the determined difference. To balance the power density among exposure beams 27, the appropriate beam splitters of system 200, such as beam splitters 66, 68, and 70, are adjusted in response to the beam balance control signal and the light source for fibers 218 is split into a first light source for the first fiber 218 and a second light source for the second fiber 218, such that the difference between the sum of the pixel intensities among the first and second exposure beams 27 is negligible. The process is repeated iteratively for the remaining fibers 218 by appropriately opening and shutting the remaining shutters of system 200, until the power density among all of the exposure beams 27 is balanced.

To achieve a selected exposure dose 248 of exposure beams 27, camera 208 images workpiece 19. By appropriately opening and closing electronic shutters of system 200, such as electronic shutters 72, 80, 90, and 100, a single fiber 218 emits an exposure beam 27. An initial optical power calibration curve is created using the sum of pixel intensities from a sub-array of pixels in the center of the camera 208 which is imaging the center of the recording plane 28 as a fiber 218 is translated to the appropriate linear position and rotated to the appropriate angular position for each period over a period range. This creates a correlation between summed pixel intensity, sPI, and period (sPI v. Period). The power density at a particular period, PD1, is measured with an optical power meter (not shown). Each value in the sPI v. Period curve is then divided by PD1 to produce a calibration curve with the units of (Summed Pixel Intensity/Power) v. Period. To determine the appropriate exposure time for a given exposure dose at a specified period is needed, the following dose calibration is performed.

The summed pixel intensity from an exposure beam centered in the recording plane 28 and incident at the appropriate angle, is measured by camera 208. The measured summed pixel intensity is divided by the dose calibration curve value at the corresponding period and an exposure beam power is calculated. The requested exposure dose is divided by the calculated exposure beam power resulting in an exposure time to achieve the requested exposure dose.

Figure 11:
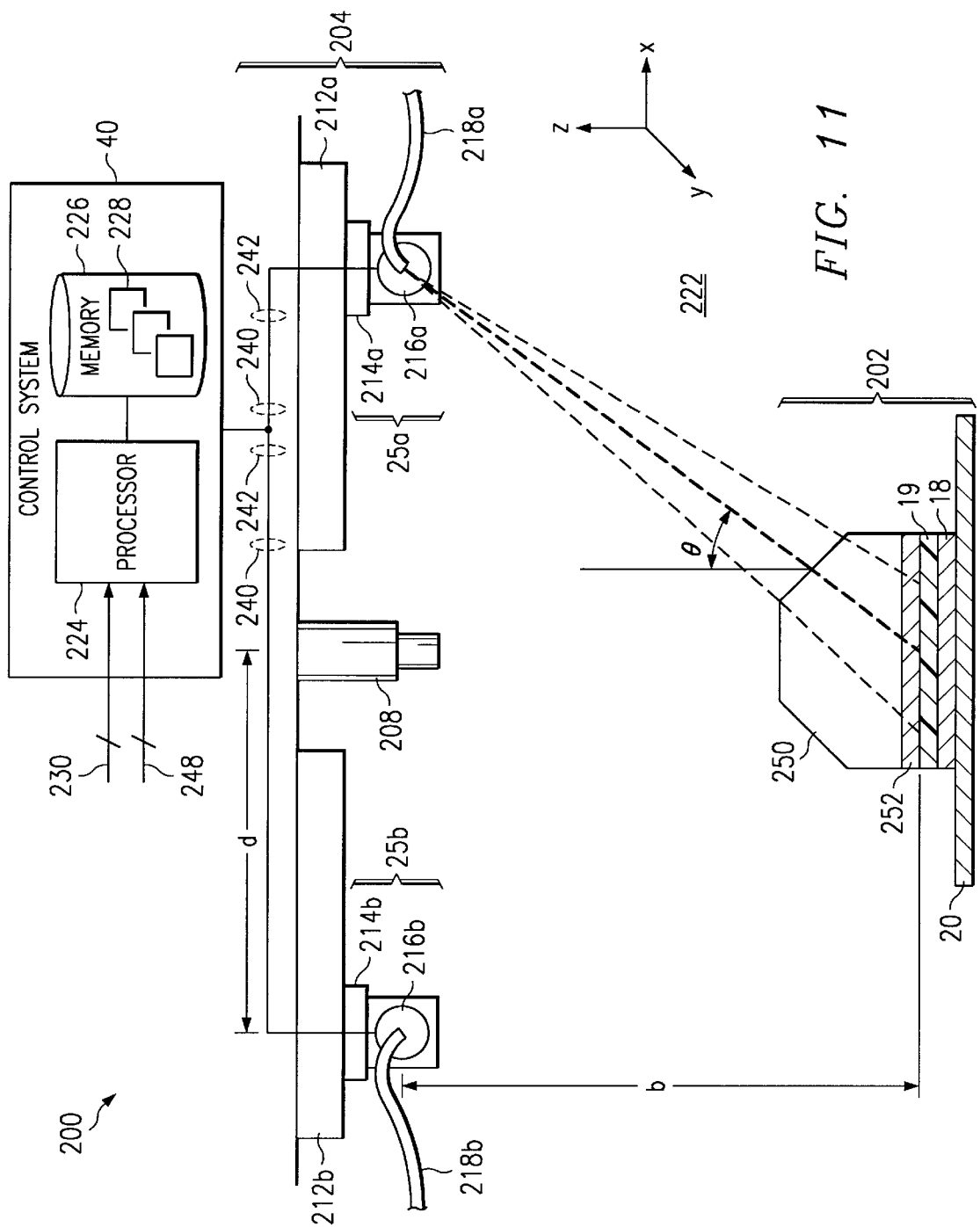
FIG. 11 illustrates a second embodiment of the interference lithography tool.

FIG. 11 illustrates another embodiment of system 200 in which platform 202 further includes a refractive medium 250 separated from workpiece 19 by a refractive medium 252. Refractive medium 250 comprises glass or any other suitable optically transmissive medium having an index of refraction, $n_2$. In one embodiment, refractive medium 250 comprises a prism. Refractive medium 252 comprises a fluid or any other suitable optically transmissive medium having an index of refraction, $n_3$. In general, system 200 generates a particular interferometric pattern of light having a particular grating period. Control system 40 adjusts the translational and rotational position of various components of the patterning device 204 to achieve a selected grating period for the interferometric pattern of light, taking into consideration the propagation of exposure beams 27 through refractive media 222, 250, and 252.

Figure 12:
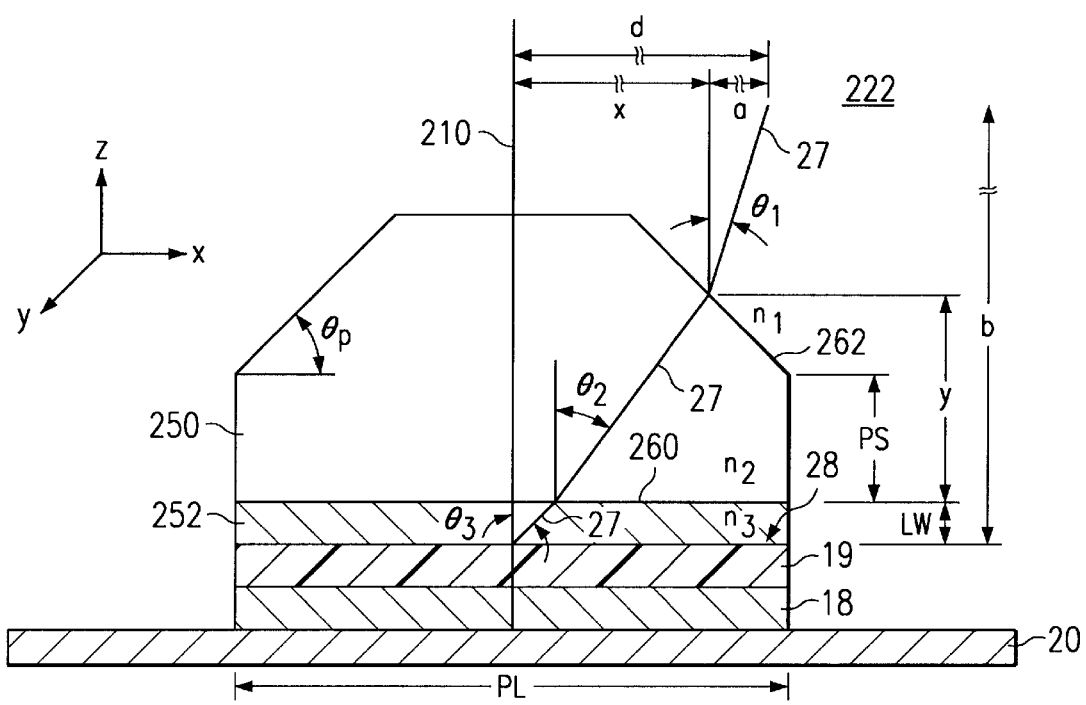
FIG. 12 illustrates in more detail the second embodiment of the interference lithography tool.

FIG. 12 illustrates in more detail the components of platform 202 illustrated in FIG. 11. The boundary between refractive medium 252 and refractive medium 250 forms an interface 260. The boundary between refractive medium 250 and refractive medium 222 forms an interface 262.

In operation of system 200 in a two-beam configuration, processor 224 receives an input 230, indicating a particular grating period of the interferometric pattern of light to be generated on workpiece 19. Processor 224 determines the propagation angle, $\theta$, and the distance, d, necessary to achieve the particular grating period indicated by input 230, according to the following two-beam configuration equations:

$$(1) \quad \Lambda = \frac{\lambda}{(2n\sin\theta)}$$

where:

Λ=period indicated by input 230;

λ=wavelength of laser beam 27;

n=$n_3$, the index of refraction for refractive medium 252; and

θ=$\theta_3$, the half-angle between exposure beams 27 propagating in refractive medium 252 (angle between chief ray and normal to wafer plane).

$$n_2 \sin\theta_2 = n_3 \sin\theta_3 \quad (2)$$

where:

$n_2$=index of refraction for refractive medium 250;

$\theta_2$=angle between chief ray and normal to wafer plane in medium 250.

$n_3$=index of refraction for refractive medium 252; and $\theta_3$=angle between chief ray and normal to wafer plane in medium 252, calculated in equation (1).

$$n_1 \sin\theta_1 = n_2 \sin\theta_2 \quad (3)$$

where:

$n_1$=index of refraction for refractive medium 222 ($n_1$=1 for air);

$\theta_1$=angle between chief ray and normal to wafer plane in medium 222;

$n_2$=index of refraction for refractive medium 250; and $\theta_2$=angle between chief ray and normal to wafer plane in $$(4) \quad d = (b-y)\tan\theta_1 + \frac{(PL/2)\tan\theta_p + PS + LW\tan\theta_3\tan(90-\theta_2)}{\tan\theta_p + \tan(90-\theta_2)}$$

where:

d=distance between distal end of fibers 218 and center of rails 212;

b=distance between distal end of fibers 218 and interface 262; and $\theta_1$ and PL, $\theta_p$, PS, LW, $\theta_3$, and $\theta_2$ are illustrated in FIG. 12.

Upon determining the appropriate position values for exposure beams 27, including propagation angle θ, and distance d, processor 224 generates a translational control signal 240 in response to the calculated distance, d, and an angular control signal 242 in response to the calculated propagation angle, θ. In one embodiment, processor 224 determines signals 240 and 242 based upon the difference between the calculated values of propagation angle θ and distance d, from equations (1) and (2), and the values for propagation angle θ and distance d stored in memory 226.

Each carriage 214 translates a corresponding fiber 218 along a corresponding rail 212 in response to the translational control signal 240. Each rotary stage 216 rotates a corresponding fiber 218 in response to angular control signal 242. In this respect, system 200 receives as input 230 a particular grating period for an interferometric pattern of light to be generated, and automatically positions fibers 218 in an appropriate translational and rotational manner.

In operation of system 200 in a three-beam configuration, as described earlier, taking into consideration the propagation of exposure beams 27 through refractive media 222, 250, and 252, processor 224 determines the appropriate angle, θ, and distance, d, necessary to achieve the particular grating period of the three-beam interferometric pattern of light, as indicated by input 230, according to the following three-beam configuration equations:

$$(1) \quad \Lambda = \left(\frac{2}{\sqrt{3}}\right) \frac{\lambda}{2n\sin[a\tan[\cos(30)\tan(\theta)]]}$$

where:

Λ=period indicated by input 230;

λ=wavelength of exposure beams 27;

n=$n_3$, the index of refraction for refractive medium 252; and

θ=$\theta_3$, the angle between the chief ray and the normal to the wafer plane in medium 252.

$$n_2 \sin\theta_2 = n_3 \sin\theta_3 \quad (2)$$

where:

$n_2$=index of refraction for refractive medium 250;

$\theta_2$=angle between the chief ray and the normal to the wafer plane in medium 250

$n_3$=index of refraction for refractive medium 252; and $\theta_3$=angle between chief ray and the normal to the wafer plane in medium 252.

$$n_1 \sin\theta_1 = n_2 \sin\theta_2 \quad (3)$$

where:

$n_1$=index of refraction for refractive medium 222;

$\theta_1$=angle between chief ray and normal to wafer plane in medium 222;

$n_2$=index of refraction for refractive medium 250; and $\theta_2$=angle between chief ray and normal to wafer plane in medium 250

$$(4) \quad d = (b-y)\tan\theta_1 + \frac{(PL/2)\tan\theta_p + PS + LW\tan\theta_3\tan(90-\theta_2)}{\tan\theta_p + \tan(90-\theta_2)}$$

where:

d=distance between distal end of fibers 218 and center of rails 212;

b=distance between distal end of fibers 218 and interface 262; and $\theta_1$ and PL, $\theta_p$, PS, LW, $\theta_3$, and $\theta_2$ are illustrated in FIG. 12.

Upon determining the appropriate position values for exposure beams 27, including propagation angle θ, and distance d, processor 224 generates a translational control signal 240 in response to the calculated distance, d, and an angular control signal 242 in response to the calculated propagation angle, θ. In one embodiment, processor 224 determines signals 240 and 242 based upon the difference between the calculated values of propagation angle θ and distance d, from equations (1) and (2), and the values for propagation angle θ and distance d stored in memory 226.

Each carriage 214 translates a corresponding fiber 218 along a corresponding rail 212 in response to the translational control signal 240. Each rotary stage 216 rotates a corresponding fiber 218 in response to angular control signal 242. In this respect, system 200 receives as input 230 a particular grating period for an interferometric pattern of light to be generated, and automatically positions fibers 218 in an appropriate translational and rotational manner.

In operation of system 200 in a four-beam configuration, as described earlier, taking into consideration the propagation of exposure beams 27 through refractive media 222, 250, and 252, processor 224 determines the appropriate angle, θ, and distance, d, necessary to achieve the particular grating period of the four-beam interferometric pattern of light, as indicated by input 230, according to the following four-beam configuration equations:

$$(1) \ \Lambda = \frac{\lambda}{\sqrt{2}} n \sin\theta$$

where:

Λ=grating period indicated by input 230;
λ=wavelength of laser beam 27;
n=$n_3$, the index of refraction for refractive medium 252; and
$\theta_3 = \theta_3$, the half-angle between exposure beams 27 propagating in refractive medium 252.

$$n_2 \sin\theta_2 = n_3 \sin\theta_3 \quad (2)$$

where:

$n_2$=index of refraction for refractive medium 250;
$\theta_2$=half-angle between chief ray and normal to wafer plane in medium 250;
$n_3$=index of refraction for refractive medium 252; and
$\theta_3$=half-angle between chief ray and normal wafer plane in medium 252.

$$n_1 \sin\theta_1 = n_2 \sin\theta_2 \quad (3)$$

where:

$n_1$=index of refraction for refractive medium 222;
$\theta_1$=half-angle between chief ray and normal to wafer plane in medium 222;
$n_2$=index of refraction for refractive medium 250; and
$\theta_2$=half-angle between chief ray and normal to wafer plane in medium 250.

$$(4) \ d = (b-y)\tan\theta_1 + \frac{(PL/2)\tan\theta_p + PS + LW\tan\theta_3 \tan(90-\theta_2)}{\tan\theta_p + \tan(90-\theta_2)}$$

where:

d=distance between distal end of fibers 218 and center of rails 212;
b=distance between distal end of fibers 218 and interface 262; and $\theta_1$ and PL, $\theta_p$, PS, LW, $\theta_3$, and $\theta_2$ are illustrated in FIG. 12.

Upon determining the appropriate position values for exposure beams 27, including propagation angle θ, and distance d, processor 224 generates a translational control signal 240 in response to the calculated distance, d, and an angular control signal 242 in response to the calculated propagation angle, θ. In one embodiment, processor 224 determines signals 240 and 242 based upon the difference between the calculated values of propagation angle θ and distance d, from equations (1) and (2), and the values for propagation angle θ and distance d stored in memory 226.

Each carriage 214 translates a corresponding fiber 218 along a corresponding rail 212 in response to the translational control signal 240. Each rotary stage 216 rotates a corresponding fiber 218 in response to angular control signal 242. In this respect, system 200 receives as input 230 a particular grating period for an interferometric pattern of light to be generated, and automatically positions fibers 218 in an appropriate translational and rotational manner.

Figure 13:
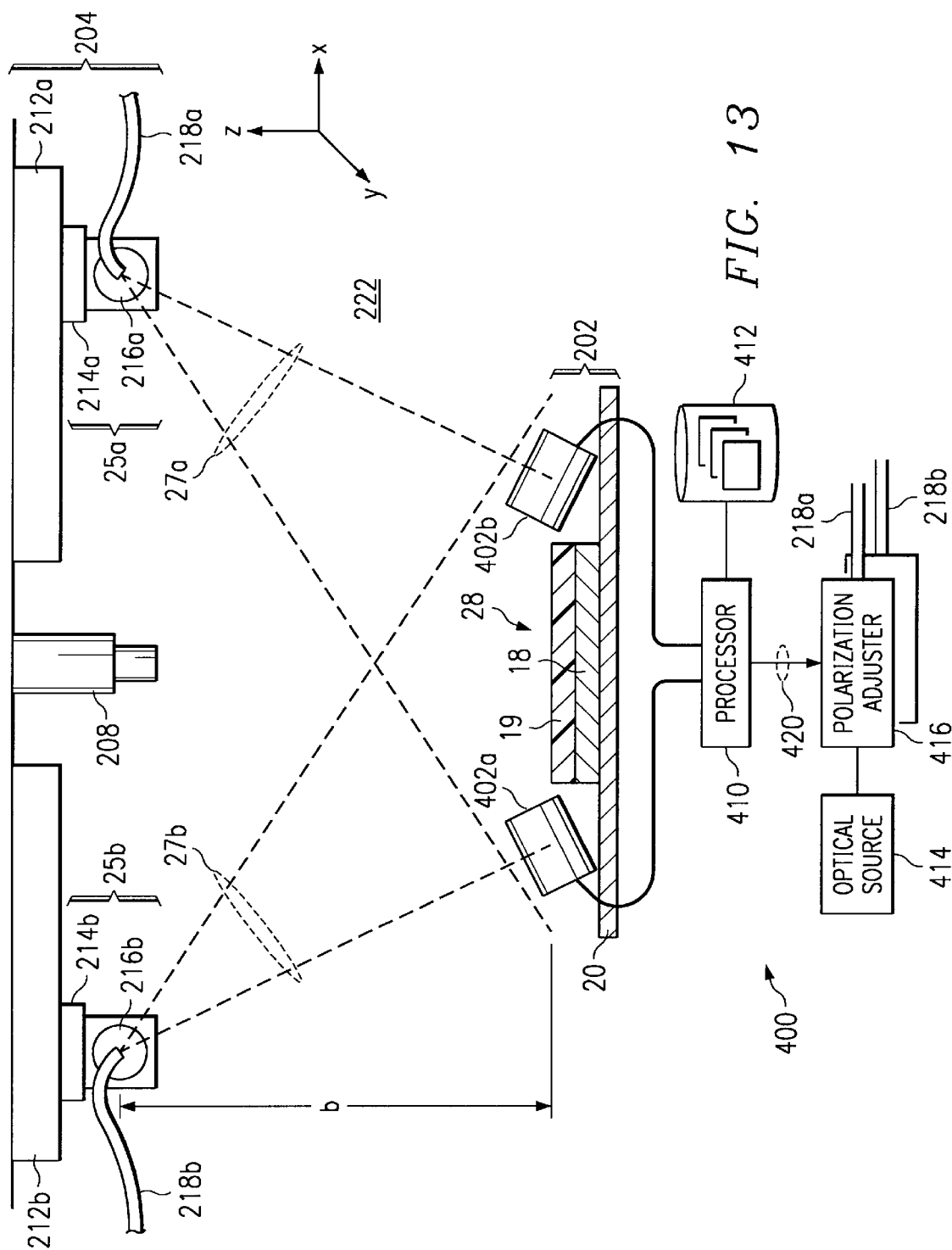
FIG. 13 illustrates an interference lithography tool incorporating a polarization vector alignment technique.

FIG. 13 illustrates one embodiment of interference lithography system 400 that incorporates a linear polarization alignment technique. System 400, in addition to the components described above, includes detectors 402a and 402b, a processor 410 and memory 412 (which may be part of computer 48), an optical source 414, and one or more polarization adjusters 416. In general, system 400 senses the polarization of exposure beams 27 and uses polarization adjusters 416 to align polarization vectors of beams 27 at an angle to maximize the overlap of polarization vectors in recording plane 28. System 400 may perform this alignment of polarization vectors of beams 27 in an automated, closed-loop process.

Detector 402a receives some portion of optical signal or exposure beam 27a emitted by fiber 218a. Detector 402a generates a control signal indicating the difference in orientation between a polarization state of the emitted optical signal 27a and a desired linear polarization vector established by detector 402a. Similarly, detector 402b receives a portion of optical signal 27b emitted from fiber 218b, and generates a similar control signal indicating the difference in orientation between a polarization state of the emitted optical signal 27b and a desired linear polarization vector established by detector 402b.

Detectors 402a and 402b may lie on, in, or in the proximity of recording plane 28. For example, although detectors 402a and 402b are shown as elements separate from recording plane 28, system 400 contemplates integrating detectors 402a and 402b into recording plane 28. The orientation of detectors 402a and 402b may be fixed generally to accept the maximum amount of optical energy from a corresponding beam 27, while reducing any interference or cross-coupling effects from other beams in system 400. In a specific embodiment, retro-reflection or other techniques can confirm that exposure beams 27 are approximately perpendicular to the active sensing element, such as a photodiode, in corresponding detectors 402a and 402b. Alternatively, system 400 may include manual adjustments or automated actuators that can change the orientation of detectors 402a and 402b as positions of fibers 218a and 218b change. Although FIG. 13 illustrates a two beam embodiment, system 400 contemplates any number of beams 27 and corresponding detectors 402 to accomplish the polarization alignment technique. Moreover, system 400 may include a polarization vector alignment technique for less than all of beams 27 used for interference lithography.

Processor 410 receives control signals generated by detectors 402 and utilizes control algorithms, coefficients, programs, or other data maintained in memory 412 to generate commands 420 to actuate polarization adjusters 416 to change the orientation of the linear polarization vector of optical signals coupled to fibers 218. Polarization adjusters 416 may be passive or active waveplates, or other devices capable of adjusting the linear polarization vector of optical signals introduced to fibers 218.

System 400 allows polarization states of beams 27 to achieve and maintain maximum overlap in recording plane 28. Initial mounting, setup, and period or pattern reconfiguration of fibers 218 may result in misaligned polarization vectors. Furthermore, polarization drift may occur over time due to factors such as stress, tight bends in fiber, or temperature changes. System 400 adjusts polarization states of beams 27 initially and continuously to maintain maximum overlap in recording plane 28 to improve the overall quality and consistency of pattern features.

Figure 14:
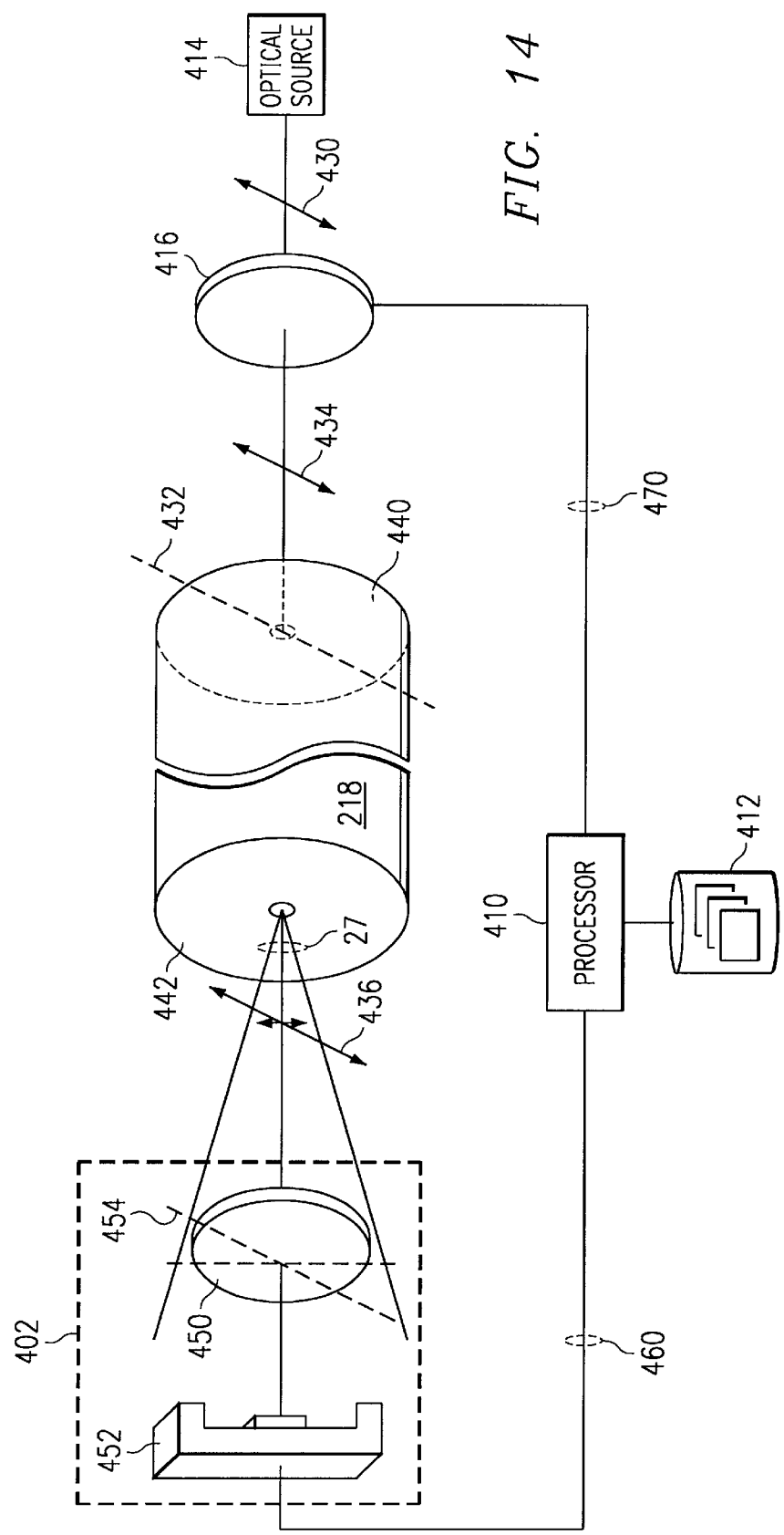
FIG. 14 illustrates a functional block diagram of the polarization vector alignment technique.

FIG. 14 illustrates in more detail a functional block diagram of the polarization vector alignment technique for one beam 27 in system 400. System 400 would perform similar parallel operations for polarization alignment of additional beams 27. Throughout this description, the term "optical signal" refers to free-space beams formed by optical source 414, optical energy in fibers 218 and beam 27, and all other instances and forms of optical energy used in system 400 for performing interference lithography. The technique begins when optical source 414 generates a free-space optical signal having an initial linear polarization vector 430 at some angle relative to a polarization maintaining axis 432 of fiber 218. The optical signal passes through polarization adjuster 416 which initially aligns linear polarization vector 434 to be approximately parallel with polarization maintaining axis 432 of fiber 218. Fiber 218 receives the optical signal at a first end 440 and communicates the optical signal to a second end 442 while substantially maintaining the alignment of the linear polarization vector 434. The optical signal emits as beam 27 from second end 442 of fiber 218. Due to polarization variances caused by stresses, tight bends, temperature changes, or other effects in fiber 218, or other misalignments or errors introduced by components in system 400, a polarization state 436 of beam 27 may be slightly different from linear polarization vector 434 of the optical signal introduced to fiber 218. In a particular embodiment, polarization state 436 of beam 27 may include a dominant component corresponding to polarization maintaining axis 432, but may also include a smaller component perpendicular to polarization maintaining axis 432 causing polarization state 436 to be slightly elliptical. Small changes in the linear polarization vector 434 of the optical signal introduced at first end 440 may adjust polarization state 436 to reduce or remove this small perpendicular component and produce beam 27 having a substantially linearly polarized signal.

Detector 402 receives a portion of beam 27. In this embodiment, detector 402 includes a polarizer 450 and a sensor 452. The orientation of polarizer 450 defines a transmission axis 454 that corresponds to the desired linear polarization vector of beam 27. Sensor 452, such as a photodiode or other suitable device to detect optical energy, detects the amount of beam 27 that passes through polarizer 450 and communicates a corresponding control signal 460 to processor 410. Control signal 460 indicates a difference in orientation between polarization state 436 of beam 27 and desired linear polarization vector 454 established by polarizer 450. Control signal 460 may be proportional or inversely proportional to this difference, or otherwise provide a signal indicating the difference in orientation between polarization state 436 and desired linear polarization vector 454. For example, a perfect alignment between polarization state 436 and desired linear polarization vector 454 may produce a maximum control signal 460. Processor 410 receives control signal 460 and, using programs, coefficients, or other data stored in memory 412, generates a command 470 that adjusts polarization adjuster 416 to reorient linear polarization vector 434 for presentation to first end 440 of fiber 218. This adjustment, in turn, causes polarization state 436 of beam 27 to become less elliptical and more linear and aligned with desired linear polarization vector 454. Throughout this description, the term "control signal" refers to any digital or analog signal or value used to adjust polarization state 436, including control signal 460, command 470, or any other suitable signal or value used by processor 410 and/or memory 412. This closed-loop process continues so that polarization state 436 of beam 27 maintains alignment with desired linear polarization vector 454 for maximum polarization vector overlap with other beams 27 to enhance the performance of system 400.

FIG. 15 illustrates a flowchart of a method 500 for performing polarization vector alignment. The method begins at step 502 where optical source 414 generates an optical signal having a linear polarization vector 430. Optical source 414 communicates the optical signal through a polarization adjuster 416 at step 504, and the optical signal couples to first end 440 of fiber 218 at step 506. In a particular embodiment, polarization vector 434 of the optical signal entering fiber 218 substantially aligns to polarization maintaining axis 432.

Fiber 218 emits the optical signal from second end 442 to produce beam 27 at step 508. System 400 communicates the optical signal through polarizer 450 having a transmission axis aligned to desired linear polarization vector 454 at step 510. Sensor 452 senses the optical signal passing through polarizer 450 at step 512 and generates a corresponding control signal 460 at step 514. Using any suitable state-based or stateless control algorithm, coefficients, or other processing, processor 410 generates command 470 at step 516. System 400 then actuates polarization adjuster 416 at step 518 in response to command 470. The method continues at step 504 where the optical signal generated by optical source 414 passes through the actuated polarization adjuster 416 to change the orientation of polarization vector 434, which causes polarization state 436 of beam 27 to align to desired linear polarization vector 454. The steps of method 500 continue to monitor and adjust the alignment of polarization state 436 of beam 27 to maximize polarization vector overlap with other beams 27.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for interference lithography, comprising:
generating an optical signal;
communicating the optical signal using a fiber having a cladding region comprising a plurality of axially formed holes surrounding a core region;
emitting the optical signal from the fiber to perform interference lithography; and
wherein the core region comprises a plurality of second axially formed holes surrounded by the axially formed holes of the cladding region, the second axially formed holes of the core region having a smaller cross section than the axially formed holes of the cladding region.

2. The method of claim 1, wherein the axially formed holes are radially organized and sized to define at least one polarization maintaining axis of the fiber.

3. The method of claim 1, wherein the core region produces photonic bandgap effects to guide the optical signal through the core region of the fiber.

4. A method for interference lithography, comprising:
generating an optical signal;
communicating the optical signal using a fiber having a cladding region comprising a plurality of axially formed holes surrounding a core region;
emitting the optical signal from the fiber to perform interference lithography; and
wherein the core region comprises a centrally aligned hole surrounded by the axially formed holes of the cladding region, the centrally aligned hole having a larger cross section than any one of the axially formed holes.

5. The method of claim 1, wherein the axially formed holes are radially organized and sized to define at least one polarization maintaining axis of the fiber.

6. The method of claim 4, wherein the core region produces photonic bandgap effects to guide the optical signal through the core region of the fiber.

7. A method for interference lithography, comprising:

generating an optical signal;

communicating the optical signal using a fiber having a cladding region comprising a plurality of axially formed holes surrounding a core region;

emitting the optical signal from the fiber to perform interference lithography; and wherein the core region comprises a centrally aligned hole surrounded by the axially formed holes of the cladding region, the centrally aligned hole having an asymmetric cross section that defines at least one polarization maintaining axis of the fiber.

8. The method of claim 7, wherein the axially formed holes are radially organized and sized to define at least one polarization maintaining axis of the fiber.

9. The method of claim 7, wherein the core region has a volume refractive index greater than the cladding region, and the fiber guides the optical signal through the core region using, at least in part, total internal reflection.

10. The method of claim 7, wherein the core region produces photonic bandgap effects to guide the optical signal through the core region of the fiber.

11. The method of claim 7, wherein the fiber is formed from a non-doped, homogenous material.

12. The method of claim 7, wherein:

the fiber is formed from non-doped, homogenous silica; and the holes contain air.

13. An apparatus for interference lithography, comprising:

a support structure;

at least two fibers coupled to the support structure and operable to emit optical signals to perform interference lithography, wherein each fiber comprises a cladding region having a plurality of axially formed holes surrounding a core region; and wherein, for each fiber, the core region comprises a plurality of second axially formed holes surrounded by the axially formed holes of the cladding region, the second axially formed holes of the core region having a smaller cross section than the axially formed holes of the cladding region.

14. The apparatus of claim 13, wherein the support structure comprises the following for each fiber:

a carriage operable to translate the fiber; and a rotary stage coupled to the carriage and operable to rotate the fiber.

15. The apparatus of claim 14, further comprising a processor operable to generate control signals for communication to the carriage and the rotary stage for each fiber to perform automated period reconfiguration of the apparatus.

16. The apparatus of claim 13, further comprising:

a laser operable to generate an optical beam;

a splitter operable to split the beam into a first optical signal and a second optical signal;

a first positioning stage operable to couple the first optical signal into a first fiber; and a second positioning stage operable to couple the second optical signal into a second fiber.

17. An apparatus for interference lithography, comprising:

a support structure;

at least two fibers coupled to the support structure and operable to emit optical signals to perform interference lithography, wherein each fiber comprises a cladding region having a plurality of axially formed holes surrounding a core region; and wherein, for each fiber, the core region comprises a centrally aligned hole surrounded by the axially formed holes of the cladding region, the centrally aligned hole having a larger cross section than any one of the axially formed holes.

18. The apparatus of claim 17, wherein the support structure comprises the following for each fiber:

a carriage operable to translate the fiber; and a rotary stage coupled to the carriage and operable to rotate the fiber.

19. The apparatus of claim 18, further comprising a processor operable to generate control signals for communication to the carriage and the rotary stage for each fiber to perform automated period reconfiguration of the apparatus.

20. The apparatus of claim 17, further comprising:

a laser operable to generate an optical beam;

a splitter operable to split the beam into a first optical signal and a second optical signal;

a first positioning stage operable to couple the first optical signal into a first fiber; and a second positioning stage operable to couple the second optical signal into a second fiber.

21. An apparatus for interference lithography, comprising:

a support structure;

at least two fibers coupled to the support structure and operable to emit optical signals to perform interference lithography, wherein each fiber comprises a cladding region having a plurality of axially formed holes surrounding a core region; and wherein, for each fiber, the core region comprises a centrally aligned hole surrounded by the axially formed holes of the cladding region, the centrally aligned hole having an asymmetric cross section that defines at least one polarization maintaining axis of the fiber.

22. The apparatus of claim 21, wherein, for each fiber, the axially formed holes are radially organized and sized to define at least one polarization maintaining axis of the fiber.

23. The apparatus of claim 21, wherein, for each fiber, the core region has a volume refractive index greater than the cladding region, and the fiber guides the optical signal through the core region using, at least in part, total internal reflection.

24. The apparatus of claim 21, wherein, for each fiber, the core region produces photonic bandgap effects to guide the optical signal through the core region of the fiber.

25. The apparatus of claim 21, wherein each fiber is formed from a non-doped, homogenous material.

26. The apparatus of claim 21, wherein each fiber is formed from non-doped, homogenous silica having axially formed air holes.

27. The apparatus of claim 21, wherein the support structure comprises the following for each fiber:

a carriage operable to translate the fiber; and a rotary stage coupled to the carriage and operable to rotate the fiber.

28. The apparatus of claim 27, further comprising a processor operable to generate control signals for communication to the carriage and the rotary stage for each fiber to perform automated period reconfiguration of the apparatus.

29. The apparatus of claim 21, further comprising:
a laser operable to generate an optical beam;
a splitter operable to split the beam into a first optical signal and a second optical signal;
a first positioning stage operable to couple the first optical signal into a first fiber; and
a second positioning stage operable to couple the second optical signal into a second fiber.

30. A method for interference lithography, comprising:
generating a first optical signal;
generating a second optical signal;
communicating the first optical signal using a first fiber having a cladding region comprising a plurality of axially formed holes surrounding a core region;
communicating the second optical signal using a second fiber having a cladding region comprising a plurality of axially formed holes surrounding a core region;
emitting the first optical signal from the first fiber;
emitting the second optical signal from the second fiber;
forming a pattern caused by interference between the first emitted optical signal and the second emitted optical signal; and
wherein, for each fiber, the core region comprises a plurality of second axially formed holes surrounded by the axially formed holes of the cladding region, the second axially formed holes of the core region having a smaller cross section than the axially formed holes of the cladding region.

31. The method of claim 30, wherein:
the first optical signal comprises a first linear polarization vector;
the second optical signal comprises a second linear polarization vector;
the first fiber comprises a first polarization maintaining axis;
the second fiber comprises a second polarization maintaining axis; and
the first polarization maintaining axis and the second polarization maintaining axis are oriented to enhance the pattern formed by the interference between the first emitted optical signal and the second emitted optical signal.

32. The method of claim 30, wherein, for each fiber, the core region produces photonic bandgap effects to guide the optical signal through the core region of the fiber.

33. A method for interference lithography, comprising:
generating a first optical signal;
generating a second optical signal;
communicating the first optical signal using a first fiber having a cladding region comprising a plurality of axially formed holes surrounding a core region;
communicating the second optical signal using a second fiber having a cladding region comprising a plurality of axially formed holes surrounding a core region;
emitting the first optical signal from the first fiber;
emitting the second optical signal from the second fiber;
forming a pattern caused by interference between the first emitted optical signal and the second emitted optical signal; and
wherein, for each fiber, the core region comprises a centrally aligned hole surrounded by the axially formed holes of the cladding region, the centrally aligned hole having a larger cross section than any one of the axially formed holes.

34. The method of claim 33, wherein:
the first optical signal comprises a first linear polarization vector;
the second optical signal comprises a second linear polarization vector;
the first fiber comprises a first polarization maintaining axis;
the second fiber comprises a second polarization maintaining axis; and
the first polarization maintaining axis and the second polarization maintaining axis are oriented to enhance the pattern formed by the interference between the first emitted optical signal and the second emitted optical signal.

35. The method of claim 33, wherein, for each fiber, the core region produces photonic bandgap effects to guide the optical signal through the core region of the fiber.

36. A method for interference lithography, comprising:
generating a first optical signal;
generating a second optical signal;
communicating the first optical signal using a first fiber having a cladding region comprising a plurality of axially formed holes surrounding a core region;
communicating the second optical signal using a second fiber having a cladding region comprising a plurality of axially formed holes surrounding a core region;
emitting the first optical signal from the first fiber;
emitting the second optical signal from the second fiber;
forming a pattern caused by interference between the first emitted optical signal and the second emitted optical signal; and
wherein, for each fiber, the core region comprises a centrally aligned hole surrounded by the axially formed holes of the cladding region, the centrally aligned hole having an asymmetric cross section that defines at least one polarization maintaining axis of the fiber.

37. The method of claim 36, wherein, for each fiber, the axially formed holes are radially organized and sized to define at least one polarization maintaining axis of the fiber.

38. The method of claim 36, wherein, for each fiber, the core region has a volume refractive index greater than the cladding region, and the fiber guides the optical signal through the core region using, at least in part, total internal reflection.

39. The method of claim 36, wherein, for each the core region produces photonic bandgap effects to guide the optical signal through the core region of the fiber.

40. The method of claim 36, wherein each fiber is formed from a non-doped, homogenous material.

41. The method of claim 36, wherein each fiber is formed from non-doped, homogenous silica having axially formed air holes.

42. The method of claim 36, wherein:
the first optical signal comprises a first linear polarization vector;
the second optical signal comprises a second linear polarization vector;
the first fiber comprises a first polarization maintaining axis;
the second fiber comprises a second polarization maintaining axis; and
the first polarization maintaining axis and the second polarization maintaining axis are oriented to enhance the pattern formed by the interference between the first emitted optical signal and the second emitted optical signal.

* * * * *